United States Patent
Katznelson et al.

[19]
[11] Patent Number: 6,157,278
[45] Date of Patent: Dec. 5, 2000

[54] HYBRID MAGNETIC APPARATUS FOR USE IN MEDICAL APPLICATIONS

[75] Inventors: Ehud Katznelson, Ramat Yishai; Yuval Zuk, Haifa; Haim Rotem, Kfar Klil, all of Israel

[73] Assignee: Odin Technologies Ltd., Yokneam, Israel

[21] Appl. No.: 09/274,671

[22] Filed: Mar. 24, 1999

Related U.S. Application Data

[63] Continuation-in-part of application No. 08/898,773, Jul. 23, 1997, Pat. No. 5,900,793.

[51] Int. Cl.$^7$ .............................. H01F 3/00; H01F 7/22; G01V 3/00; G01R 33/20
[52] U.S. Cl. .................... 335/296; 335/298; 335/299; 335/306; 324/319; 324/320
[58] Field of Search ............................ 335/216, 296–306; 324/318–320; 600/410, 407, 421, 422

[56] References Cited

U.S. PATENT DOCUMENTS

| | | | |
|---|---|---|---|
| 4,829,252 | 5/1989 | Kaufman | 324/309 |
| 4,875,485 | 10/1989 | Matsutani . | |
| 5,134,374 | 7/1992 | Breneman et al. | 324/319 |
| 5,304,933 | 4/1994 | Vavrek et al. | 324/318 |
| 5,309,106 | 5/1994 | Miyajima et al. | 324/318 |
| 5,332,971 | 7/1994 | Aubert | 324/319 |
| 5,410,287 | 4/1995 | Laskaris et al. | 335/216 |
| 5,428,292 | 6/1995 | Dorri et al. | 324/319 |
| 5,517,169 | 5/1996 | Laskaris et al. | 335/301 |
| 5,565,831 | 10/1996 | Dorri et al. | 335/216 |
| 5,568,102 | 10/1996 | Dorri et al. | 335/216 |
| 5,574,417 | 11/1996 | Dorri et al. | 335/216 |
| 5,880,661 | 3/1999 | Davidson et al. | 335/306 |
| 5,900,793 | 5/1999 | Katznelson et al. | 335/296 |

*Primary Examiner*—Lincoln Donovan
*Assistant Examiner*—Raymond Barrera
*Attorney, Agent, or Firm*—Eitan, Pearl, Latzer & Cohen-Zedek

[57] ABSTRACT

Permanent magnet assemblies and hybrid magnetic apparatus are disclosed for use in medical applications, particularly permanent magnet assemblies for use in Magnetic Resonance Imaging (MRI) and/or Magnetic Resonance Therapy (MRT) to produce a volume of substantially uniform magnetic field in a restricted part of the patient's body in a region either adjacent to the surface of one permanent magnet assembly or between a set of a first and second permanent magnet assemblies, leaving open access to the patient's body. The assemblies consist of a plurality of annular concentric magnets spaced-apart along their axis of symmetry. A method for constructing such annular permanent magnetic assemblies is disclosed, using equi-angular segments permanently magnetized. The hybrid magnetic apparatus includes an electromagnet flux generator for generating a first magnetic field in the volume, and permanent magnet assemblies for generating a second magnetic field superimposed on the first magnetic field for providing a substantially homogenous magnetic field having improved magnitude within the volume.

23 Claims, 16 Drawing Sheets

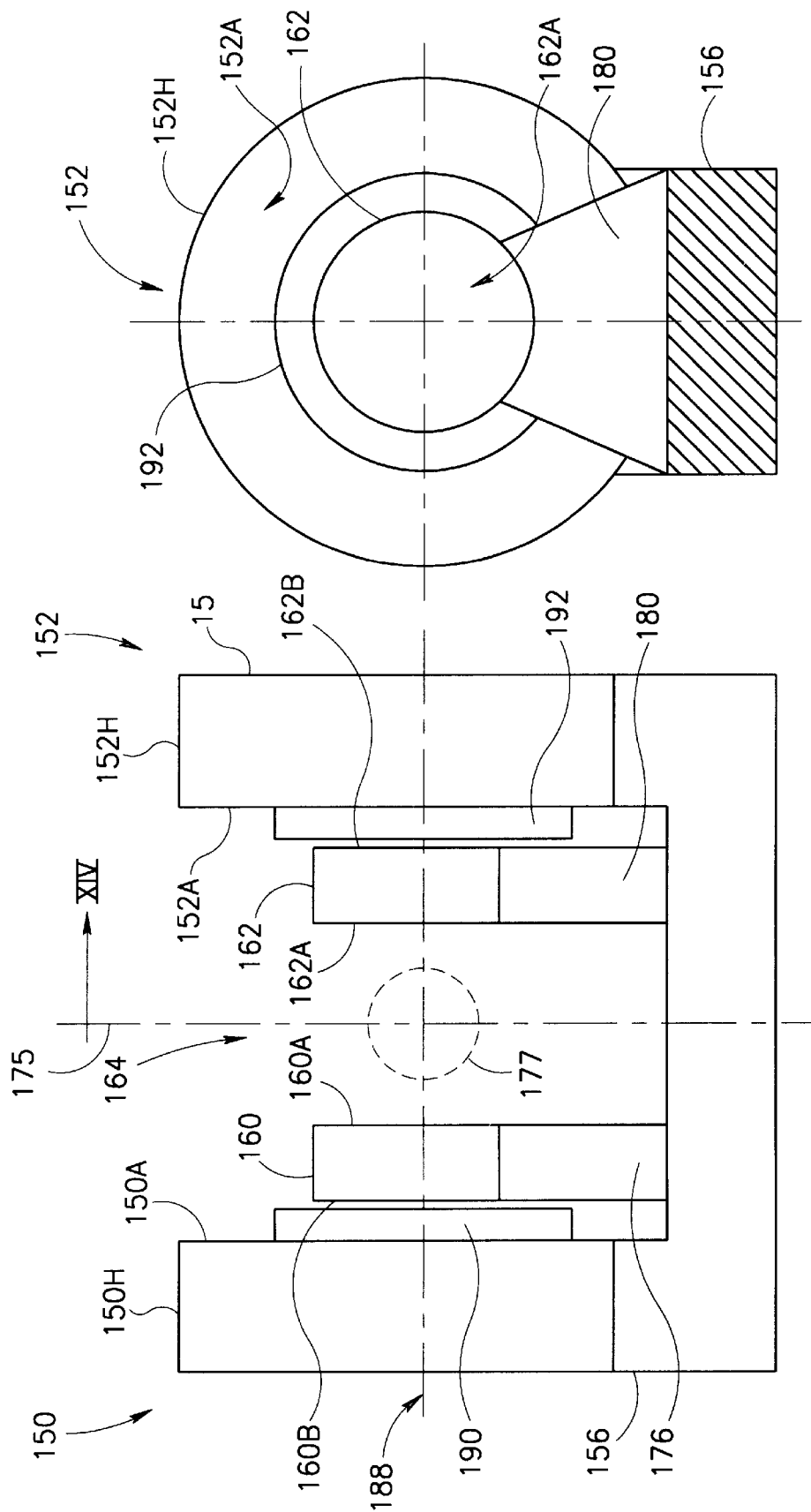

HYBRID MAGNETIC APPARATUS FOR USE IN MEDICAL APPLICATIONS

RELATED U.S. APPLICATIONS

This application is a continuation in part of U.S. patent application Ser. No. 08/898,773 to Katznelson et al., titled "PERMANENT MAGNETIC ASSEMBLIES FOR USE IN MEDICAL APPLICATIONS", filed Jul. 23, 1997, now U.S. Pat. No. 5,900,793, assigned to the assignee of the present invention and incorporated herein by reference in its entirety.

FIELD OF THE INVENTION

This invention relates to permanent magnet assemblies for use in medical applications and particularly to permanent magnet assemblies for use in Magnetic Resonance Imaging (MRI) and/or Magnetic Resonance Therapy (MRT) which produce a predetermined volume of substantially uniform magnetic field extending in a first direction beyond the surface of the permanent magnet assemblies.

BACKGROUND OF THE INVENTION

The principles of MRI are set forth in several patents such as U.S. Pat. No. 5,304,933, which is incorporated herein by reference. MRT, sometimes referred to as interventional MRI or intraoperative MRI, is the performance of an interventional medical procedure on a patient in an MRI system. During the procedure, a surgical instrument is inserted into a patient in order to perform the procedure at a predetermined site in the body. The MRT system is used in this case to monitor in quasi real-time the correct placement of the instrument and also to observe the nature and the extent of the effect of the intervention on the tissue.

In an MRI and/or MRT system a strong uniform magnetic field is required in order to align an objects nuclear spins along the z-axis of a Cartesian coordinate system having mutually orthogonal x-y-z areas. The required strong uniform magnetic field, used for full body imaging, is normally in the order of 0.1 to 2 Tesla. The imaging quality and the accuracy of an MRI and/or MRT system is dependent on the degree of uniformity of the strong uniform magnetic field. Uniformity is critical in MRI and/or MRT applications because if the strong uniform magnetic field is not properly uniform within the volume of interest, the desired discrimination between different elements, due to the finely controlled magnetic field gradient, will be subject to misinterpretation. Typically, the uniformity required for the strong uniform magnetic field is within the order of 10 ppm within the volume of interest. It is essential for MRT systems used in interventional procedures to be based on an open structure, so as to provide the physician easy access to the intervention site. Presently, most MRI systems employ a large magnet, which effectively surrounds the whole body of the patient, to produce the strong uniform magnetic field. Such magnets are usually large superconductor resistive or permanent magnets, each of which is expensive and heavy. Further, the access to the patient in these cases is obstructed.

Attempts have been made to provide open magnets for interventional procedures by employing two spaced-apart Helmholtz superconductive coil assemblies. They provide only limited space between the assemblies allowing for constricted access by only one person, such as a surgeon. See U.S. Pat. No. 5,410,287 (Laskaris et al.) and U.S. Pat. No. 5,428,292 (Dorri et al.).

U.S. Pat. No. 4,875,485 (Matsutani) disclosed an apparently more compact configuration, based on a pair of spaced-apart superconductive Helmholtz coil assemblies, arranged for movement relative to a platform carrying the patient. The access to the patient remains restricted in this case as well, due to the additional space occupied by the cryostat. Also, the movement of the coils independently of one another is impractical, because the superconducting properties of the coils require extreme precision in positioning of the two poles, in the absence of which the magnetic system quenches.

In comparison to superconductive systems, permanent magnets are less expensive, generate only a minimal unwanted fringe field and are not involved with liquefied gas handling or vacuum requirements. Open access MRI systems based on permanent magnets have been disclosed by U.S. Pat. No. 4,829,252 (Kaufman) and U.S. Pat. No. 5,134,374 (Breneman). Both are using a pair of opposing magnetic flat circular poles, employed one above the other, with the patient lying down between the magnets. The poles are mounted on end plates, supported by connecting members, which provide return paths for the magnetic flux. These systems are massive and immobile and the access to the patient is encumbered by the supporting structure.

A pair of opposing permanent magnet assemblies for use in MRI, each made of concentric magnetic rings, composed of a set of magnetic polygonal blocks, is disclosed in U.S. Pat. No. 5,332,971 (Aubert). Aubert teaches that the opposing concentric rings within each of the pairs of permanent magnets are to be spaced apart from each other the same distance. The magnet is massive, weighing about 3 tons and is therefore not amenable to movement relative to a patient's body.

In each of the above prior art magnets, used for providing the large uniform magnetic field for MRI and/or MRT applications, the magnetic field is generated in a first stage as uniformly as possible. More uniformity is achieved subsequently by shimming.

Co-pending U.S. patent application Ser. No. 09/161,336, to Zuk et al., titled "MAGNETIC APPARATUS FOR MRI", filed Sep. 25, 1998, assigned to the assignee of the present invention, the entire specification of which is incorporated herein by reference disclosed, inter alia, magnetic apparatus including an opposing pair of permanent magnetic assemblies defining an open region therebetween in which an organ or body part is positioned for imaging. The magnetic apparatus includes a plurality of gradient coils at least one of which is positioned outside of the open region.

SUMMARY OF THE INVENTION

It is therefore an object of the present invention to provide a permanent magnet assembly for use in medical applications including MRI and/or MRT.

It is a further object of the present invention to provide a single annular permanent magnet assembly for use in medical applications including MRI and/or MRT applications which extends the volume of substantially uniform magnetic field in a region adjacent to the surface of the permanent magnet assembly.

It is a further object of the present invention to provide a single annular permanent magnet assembly allowing free access to the volume of substantially uniform magnetic field from the upper surface of the single annular permanent assembly.

It is a further object of the present invention to provide a single annular permanent magnet assembly, enabling insertion therethrough of a medical instrument in a direction substantially parallel to the direction of the uniform magnetic field.

It is a further object of the present invention to provide a first compact annular permanent magnet assembly which is connected to a second compact annular permanent magnet assembly through a connecting means for use in medical applications including MRI and/or MRT which extend the substantially uniform volume of magnet field in a region between the first and second permanent magnet assemblies allowing lateral access around the uniform volume.

It is a further object of the present invention to provide a permanent magnet assembly which is compact, light, inexpensive and movable with respect to a patient support.

It is yet a further object of the present invention to provide a method for constructing an annular permanent magnet assembly for use in an MRI and/or MRT device to produce a predetermined volume of substantially uniform magnetic field extending in a first direction beyond an upper surface of the permanent magnet assembly.

With these and other objects in view, the present invention contemplates a permanent magnet assembly for use in an MRI and/or MRT device to produce a predetermined volume of substantially uniform magnetic field extending in a first direction beyond an upper surface of the permanent magnet assembly. The permanent magnet assembly includes a first annular permanent magnet having an upper and a lower surface, the upper surface of the first annular permanent magnet being of a first magnetic polarity and the lower surface of the first annular permanent magnet being of a second magnetic polarity, the first annular permanent magnet having an inside diameter, the first annular permanent magnet having at least a portion of the upper surface of the first annular magnet lying in a first plane to provide a first magnetic field in the predetermined volume, the first magnetic field having a zero rate of change in the first direction perpendicular to the first plane at a first point in the predetermined volume. The permanent magnet assembly also including at least a second annular permanent magnet having an upper and a lower surface, the upper surface of the second annular permanent magnet being of the said first magnetic polarity and the lower surface of the second annular permanent magnet being of the said second magnetic polarity, the second annular permanent magnet having an outside diameter which is smaller than the inside diameter of the first annular permanent magnet, the second annular permanent magnet providing a second magnetic field. The permanent magnet assembly finally including low permeability material interconnecting the first annular permanent magnet with the second annular permanent magnet, so that at least a portion of the upper surface of the second annular permanent magnet is in a second plane spaced from the first plane, whereby the second magnetic field is superimposed on the first magnetic field, in the predetermined volume, having a zero rate of change in the first direction at a second point different from the first point. The low permeability material interconnecting the first annular permanent magnet and the second annular permanent magnet is preferably a high thermal conductivity material and is slotted in order to reduce eddy currents.

In one embodiment of the invention, a permanent magnet assembly for use in an MRI and/or MRT device is provided to produce a predetermined volume of substantially uniform magnetic field extending in a first direction beyond an upper surface of the permanent magnet assembly. The permanent magnet assembly includes an annular permanent magnet having an upper and a lower surface, the upper surface of the annular permanent magnet having a first portion thereof lying in the first plane to provide a first magnetic field in the predetermined volume, the first magnetic field having a zero rate of change in the first direction perpendicular to the first plane at a first point in the predetermined volume. The upper surface of the annular permanent magnet has a second portion thereof lying in a second plane forming a step and providing a second magnetic field in the predetermined volume, the second magnetic field having a zero rate of change in the first direction at a second point in the predetermined volume.

In another embodiment of the invention the upper surface of the first and second annular permanent magnets each comprise a plurality of steps. Each of the steps may be parallel to the first plane.

In another embodiment of the invention the upper surface of the first and second annular permanent magnets are each inclined with respect to the first plane.

In another embodiment of the invention the first and second annular permanent magnets are movably mounted in their permanent magnet assembly, their location along the axis of symmetry being determined by a set of adjustment screws.

In still another embodiment of the invention a magnetic structure for use in an MRI and/or MRT device is provided to produce a predetermined volume of substantially uniform magnetic field in a region including a first permanent magnet assembly having a first and a second surface and a second permanent magnet assembly having a first and a second surface. The structure further includes a mounting of low permeability material for mounting the first permanent magnet assembly at a first location with the first surface thereof facing one side of the region, and the second permanent magnet assembly at a second location with the first surface thereof facing the first surface of the first permanent magnet assembly on an opposite side of the region so that the region is between the first surfaces of the first and second permanent magnet assemblies, with lateral free access from around. The first permanent magnet assembly has a first annular permanent magnet with a first and a second surface. The first surface of the first annular permanent magnet is of a first magnetic polarity and the second surface of the first annular permanent magnet is of a second magnetic polarity. The first annular permanent magnet has an inside diameter. At least a portion of the first surface of the first annular magnet lies in a first plane to provide a first magnetic field in the region, the first magnetic field having a zero rate of change in a first direction at a first point in the region. The first magnet assembly also has at least a second annular magnet with a first and a second surface. The first surface of the second annular permanent magnet is of the first magnetic polarity and the second surface of the second annular permanent magnet is of the the second magnetic polarity. The second annular permanent magnet has an outside diameter which is smaller than the inside diameter of the first annular permanent magnet, with at least a portion of the first surface of the second annular magnet lying in a second plane spaced from the first plane to provide a second magnetic field whereby the second magnetic field is superimposed upon the first magnetic field in the region, the second magnetic field having a zero rate of change in the first direction at a second point different from the first point. The second permanent magnet assembly has a third annular permanent magnet with a first and a second surface. The first surface of the third annular permanent magnet is of the second magnetic polarity and the second surface of the third annular permanent magnet is of the first magnetic polarity. The third annular permanent magnet has an inside diameter. The third annular permanent magnet has at least a portion of the first surface of the third annular magnet lying in a third plane to provide a third magnetic field, whereby the third magnetic field is superimposed upon the first and second magnetic fields in the region. The third magnetic field has a zero rate of change in the first direction at a third point different from the first and second points. The second magnet assembly also has at least a fourth annular magnet having a first and a second surface. The first surface of the fourth annular permanent magnet is of the second magnetic polarity and the second surface of the fourth annular permanent magnet is of the first magnetic polarity. The fourth annular permanent magnet has an outside diameter which is smaller than the inside diameter of the third annular permanent magnet, with at least a portion of the first surface of the fourth annular permanent magnet lying in a fourth plane spaced from the third plane to provide a fourth magnetic field whereby the fourth magnetic field is superimposed on the first, second and third magnetic fields in the region. The fourth magnetic field has a zero rate of change in the first direction at, a fourth point different from the first, second and third points.

In another embodiment of the invention, the first and second annular permanent magnets are movably mounted in their respective permanent magnet assembly, their location along the axis of symmetry being determined by a set of adjustment screws. The third and fourth annular permanent magnets are movably mounted in their respective permanent magnetic assembly, their location along the axis of symmetry being determined by another set of adjustment screws.

In another embodiment of the invention, the first and second permanent magnet assemblies further include an outer casing capable of attachment to the mounting.

In another embodiment of the invention the mounting includes a frame, connected to a set of jaws by a movable screw. The movable screw may be moved so as to rotate one or more of the jaws around an axis passing along the screw, thereby allowing broader access to a patient's body part positioned between the first and second permanent magnet assemblies.

In another embodiment of the invention the frame is controlled by a MRI compatible motor so that the frame moves in a series of horizontal positions, so that a composite image is formed.

In another embodiment of the invention the motor control of the frame displaces the first and second permanent magnet assemblies in an axial direction to bring the first and second permanent magnet assemblies either closer together or farther apart from each other.

In accordance with the method of this invention a permanent magnet assembly is constructed for use in an MRI and/or MRT device to produce a predetermined volume of substantially uniform magnet field in a region. The method includes selecting segments from a batch of equi-angular segments, manufactured to have the same magnetization, so that variations in a magnetic field of adjacent segments caused by inherent manufacturing inaccuracies follow a cyclic curve having a regular period. The method also includes combining the segments to form a first annular permanent magnet. The first annular permanent magnet has a first and a second surface thereof.

In another embodiment of the method, the method includes selecting segments from a batch of equi-angular segments, manufactured to have the same magnetization, so that variations in a magnetic field of adjacent segments caused by inherent manufacturing inaccuracies follow a cyclic curve having a regular period and combining the segments to form a second annular permanent magnet. The second annular permanent magnet has a first and a second surface thereof. The first and second annular magnets are then interconnected with a low permeability material so as to form a first permanent magnet assembly.

In another embodiment of the method, the method includes selecting segments from a batch of equi-angular segments, manufactured to have the same magnetization, so that variations in a magnetic field of adjacent segments caused by inherent manufacturing inaccuracies follow a cyclic curve having a regular period. The method also includes combining the segments to form a third annular permanent magnet. The third annular permanent magnet has a first and a second surface thereof.

In another embodiment of the method, the method includes selecting equi-angular segments from a bath of segments, manufactured to have the same magnetization, so that variations in a magnetic field of adjacent segments caused by inherent manufacturing inaccuracies follow a cyclic curve having a regular period and combining the segments to form a fourth annular permanent magnet. The fourth annular permanent magnet has a first and a second surface thereof. The third and fourth annular magnets are then interconnected with a low permeability material so as to form a second permanent magnet assembly.

In another embodiment of the method, the method includes forming a magnetic structure by mounting the first permanent magnet assembly on a mounting of low permeability material at a first location with the first surface thereof facing one side of the region, and the second annular permanent magnet at a second location with the first surface thereof facing the first surface of the first annular permanent magnet on an opposite side of the region. The region is between the first surfaces of the first and second annular permanent magnets. The method still further includes positioning the complementary annular permanent magnets so that the respective cyclic curves are in anti-phase with each other, whereby the variations in magnetic fields of adjacent segments from an average given value cancel each other out to produce a substantially uniform magnetic field in the region.

There is further provided, in accordance with a preferred embodiment of the present invention an open magnetic apparatus for use in an MRI or IMRI device to produce a predetermined volume of substantially uniform magnetic field directed parallel to an axis of symmetry of the volume. The apparatus includes a first electromagnet assembly disposed at a first position along the axis, the first electromagnet assembly includes at least a first electromagnet coil. The first coil is radially symmetric with respect to the axis. The apparatus further includes a second electromagnet assembly disposed at a second position spaced apart from the first position of the electromagnet assembly along the axis. The second electromagnet assembly includes at least a second electromagnet coil, which is radially symmetric with respect to the axis. The first coil and the second coil are equidistant from the center of the volume. The first electromagnet assembly and the second electromagnetic assembly are adapted for generating a first magnetic field within the volume. The apparatus further includes a first permanent magnet assembly positioned at a third position disposed between the first position and the second position along the axis. The first permanent magnet assembly has an inner surface facing the volume and an outer surface facing the first electromagnet assembly. The first permanent magnet assembly includes a first permanent magnet having an outer diameter. The first permanent magnet is radially symmetric with respect to the axis and has a first magnetization direction parallel to the axis. The first permanent magnet assembly further includes at least a second annular permanent magnet coaxial with the first permanent magnet. the second permanent magnet has an inner diameter larger than the outer diameter of the first permanent magnet. The second permanent magnet is radially symmetric with respect to the axis and has a second magnetization direction parallel to the axis. The first permanent magnet assembly further includes a first low magnetic permeability frame for supporting the first permanent magnet and the second permanent magnet. The apparatus further includes a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes a third permanent magnet having an outer diameter. The third permanent magnet is radially symmetric with respect to the axis and has a magnetization direction identical to the first magnetization direction. The second permanent magnet assembly further includes at least a fourth permanent magnet coaxial with the third permanent magnet. The fourth permanent magnet has an inner diameter larger than the outer diameter of the third permanent magnet. The fourth permanent magnet is radially symmetric with respect to the axis and has a magnetization direction identical to the second magnetization direction. The second permanent magnet assembly further includes a second low magnetic permeability frame for supporting the third permanent magnet and the at least fourth permanent magnet. The inner surface of the first permanent magnet assembly and the inner surface of the second permanent magnet assembly define an open region therebetween. The volume is disposed within the open region. The third position of the first permanent magnetic assembly and the fourth position of second permanent magnetic assembly are equidistant along the axis from the center of the volume. The first permanent magnetic assembly and the second permanent magnetic assembly are adapted to generate a second magnetic field superimposed on the first magnetic field to provide the substantially uniform magnetic field within the volume.

Furthermore, in accordance with another preferred embodiment of the present invention, the first magnetization direction is oriented parallel to the second magnetization direction.

Furthermore, in accordance with another preferred embodiment of the present invention, the first magnetization direction is oriented anti-parallel to the second magnetization direction.

Furthermore, in accordance with another preferred embodiment of the present invention, the first electromagnet coil and the second electromagnet coil are operatively arranged as a Helmholtz pair.

Furthermore, in accordance with another preferred embodiment of the present invention, the first low magnetic permeability frame is adapted for varying the position of at least the first permanent magnet along the axis, and the second low magnetic permeability frame is adapted for varying the position of at least the third permanent magnet along the axis.

Furthermore, in accordance with another preferred embodiment of the present invention, the first low magnetic permeability frame is adapted for varying the tilt angle of at least the first permanent magnet with respect to the axis, and the second low magnetic permeability frame is adapted for varying the tilt angle of at least the third permanent magnet with respect the axis.

Furthermore, in accordance with another preferred embodiment of the present invention, the first electromagnet coil and the second electromagnet coil are resistive electromagnet coils.

Furthermore, in accordance with another preferred embodiment of the present invention, the first electromagnet coil and the second electromagnet coil are superconducting electromagnet coils.

Furthermore, in accordance with another preferred embodiment of the present invention, the magnetic apparatus further includes a first gradient coil assembly disposed between the outer surface of the first permanent magnet assembly and the first electromagnet assembly, and a second gradient coil assembly disposed between the outer surface of the second permanent magnet assembly and the second electromagnet assembly.

Furthermore, in accordance with another preferred embodiment of the present invention, each of the first gradient coil assembly and the second gradient coil assembly includes one or more gradient coils selected from an x-gradient coil, a y-gradient coil, a z-gradient coil and any combination thereof.

Furthermore, in accordance with another preferred embodiment of the present invention, each of the first gradient coil assembly and the second gradient coil assembly is a multi-layer printed circuit assembly, and at least one of the x-gradient coil, y-gradient coil and z-gradient coil of each of the first gradient coil assembly and the second gradient coil assembly is a substantially planar printed circuit coil.

Furthermore, in accordance with another preferred embodiment of the present invention, the first and the third permanent magnets are selected from a disc-like permanent magnet having a circular cross section in a plane perpendicular to the axis, a regular right polygonal prism-like permanent magnet having a regular polygonal cross-section in a plane perpendicular to the axis and having N sides, a ring-like annular permanent magnet and a annular right regular polygonal permanent magnet having N sides.

Furthermore, in accordance with another preferred embodiment of the present invention, N is equal to or larger than eight.

Furthermore, in accordance with another preferred embodiment of the present invention, the second and the fourth permanent magnets are selected from a ring-like annular permanent magnet and an annular right regular polygonal permanent magnet having N sides.

Furthermore, in accordance with another preferred embodiment of the present invention, N is equal to or larger than eight.

Furthermore, in accordance with another preferred embodiment of the present invention, the first electromagnet coil and the second electromagnet coil are selected from a circular coil and a regular polygonal shaped coil having N sides.

Furthermore, in accordance with another preferred embodiment of the present invention, N is equal to or larger than eight.

Furthermore, in accordance with another preferred embodiment of the present invention, the first permanent magnet and the third permanent magnet include a plurality of permanently magnetized segments attached to adjacent segments using a non-conductive adhesive, so as to reduce eddy currents.

Furthermore, in accordance with another preferred embodiment of the present invention, the segments are equi-angular segments.

Furthermore, in accordance with another preferred embodiment of the present invention, the second annular permanent magnet and the fourth annular permanent magnet include a plurality of permanently magnetized segments attached to adjacent segments using a non-conductive adhesive, so as to reduce eddy currents.

Furthermore, in accordance with another preferred embodiment of the present invention, the segments are equi-angular segments.

There is further provided a method for constructing an open magnetic apparatus for use in an MRI or IMRI device to produce a predetermined volume of substantially uniform magnetic field directed parallel to an axis of symmetry of the volume, the method includes the steps of providing a first electromagnet assembly disposed at a first position along the axis. The first electromagnet assembly includes at least a first electromagnet coil, the first coil is radially symmetric with respect to the axis. The method also includes the step of providing a second electromagnet assembly disposed at a second position spaced apart from the first position of the electromagnet assembly along the axis. The second electromagnet assembly includes at least a second electromagnet coil. The second coil is radially symmetric with respect to the axis. The first coil and the second coil are equidistant from the center of the volume. The first electromagnet assembly and the second electromagnetic assembly are adapted for generating a first magnetic field within the volume. The method also includes the step of providing a first permanent magnet assembly positioned at a third position disposed between the first position and the second position along the axis. The first permanent magnet assembly has an inner surface facing the volume and an outer surface facing the first electromagnet assembly. The first permanent magnet assembly includes a first permanent magnet having an outer diameter. The first permanent magnet is radially symmetric with respect to the axis and has a first magnetization direction parallel to the axis. The first permanent magnet assembly further includes at least a second annular permanent magnet coaxial with the first permanent magnet. The second permanent magnet has an inner diameter larger than the outer diameter of the first permanent magnet. The second permanent magnet is radially symmetric with respect to the axis and has a second magnetization direction parallel to the axis. The first permanent magnet assembly also includes a first low magnetic permeability frame for supporting the first permanent magnet and the at least second permanent magnet. The method also includes the step for providing a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes a third permanent magnet having an outer diameter. The third permanent magnet is radially symmetric with respect to the axis and has a magnetization direction identical to the first magnetization direction. The second permanent magnet assembly also includes at least a fourth permanent magnet coaxial with the third permanent magnet. The fourth permanent magnet has an inner diameter larger than the outer diameter of the third permanent magnet. The fourth permanent magnet is radially symmetric with respect to the axis and has a magnetization direction identical to the second magnetization direction. The second permanent magnet assembly also includes a second low magnetic permeability frame for supporting the third permanent magnet and the fourth permanent magnet. The inner surface of the first permanent magnet assembly and the inner surface of the second permanent magnet assembly define an open region therebetween. The volume is disposed within the open region. The third position of the first permanent magnetic assembly and the fourth position of second permanent magnetic assembly are equidistant along the axis from the center of the volume. The first permanent magnetic assembly and the second permanent magnetic assembly are adapted to generate a second magnetic field superimposed on the first magnetic field to provide the substantially uniform magnetic field within the volume.

Finally, there is also provided a method for providing a substantially homogenous magnetic field within a volume disposed in an open region within a magnetic apparatus. The method includes the steps of providing a first electromagnet assembly disposed at a first position along the axis. The first electromagnet assembly includes at least a first electromagnet coil. The first coil is radially symmetric with respect to the axis. The first step of providing also includes providing a second electromagnet assembly disposed at a second position spaced apart from the first position of the electromagnet assembly along the axis. The second electromagnet assembly includes at least a second electromagnet coil. The second coil is radially symmetric with respect to the axis. The first coil and the second coil are equidistant from the center of the volume. The method further includes the step of providing a first permanent magnet assembly positioned at a third position disposed between the first position and the second position along the axis. The first permanent magnet assembly has an inner surface facing the volume and an outer surface facing the first electromagnet assembly. The first permanent magnet assembly includes a first permanent magnet having an outer diameter. The first permanent magnet is radially symmetric with respect to the axis and has a first magnetization direction parallel to the axis. The first permanent magnet assembly also includes at least a second annular permanent magnet coaxial with the first permanent magnet. The second permanent magnet has an inner diameter larger than the outer diameter of the first permanent magnet. The second permanent magnet is radially symmetric with respect to the axis and has a second magnetization direction parallel to the axis. The first permanent magnet assembly also includes a first low magnetic permeability frame for supporting the first permanent magnet and the second permanent magnet. The second step of providing also includes providing a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes a third permanent magnet having an outer diameter. The third permanent magnet is radially symmetric with respect to the axis and has a magnetization direction identical to the first magnetization direction. The second permanent magnet assembly also includes at least a fourth permanent magnet coaxial with the third permanent magnet. The fourth permanent magnet has an inner diameter larger than the outer diameter of the third permanent magnet. The fourth permanent magnet is radially symmetric with respect to the axis and has a magnetization direction identical to the second magnetization direction. The second permanent magnet assembly also includes a second low magnetic permeability frame for supporting the third permanent magnet and the at least fourth permanent magnet. The inner surface of the first permanent magnet assembly and the inner surface of the second permanent magnet assembly define an open region therebetween. The volume is disposed within the open region. The third position of the first permanent magnetic assembly and the fourth position of second permanent magnetic assembly are equidistant along the axis from the center of the volume. The first permanent magnetic assembly and the second permanent magnetic assembly generate a first permanent magnetic field in the volume. The method further includes the step of electrically energizing the first electromagnet assembly and the second electromagnetic assembly to provide a second magnetic field within the volume, wherein the second magnetic field is superimposed on the first permanent magnetic field to provide the substantially uniform magnetic field within the volume.

DESCRIPTION OF THE DRAWINGS

In order to understand the invention and see how it may be carried out in practice, several preferred embodiments will now be described, by way of non-limiting example only, with reference to the accompanying drawings, in which like components are designated by like reference numerals:

FIG. 13 is a schematic diagram illustrating a front view of an open hybrid magnetic apparatus for MRI/MRT including an electromagnet flux generator and permanent magnet assemblies, in accordance with another preferred embodiment of the present invention;

FIG. 14 is a cross sectional view of the hybrid magnetic apparatus of FIG. 13, taken along the lines XIV–XIV;

DETAILED DESCRIPTION OF THE INVENTION

The present invention is based, in part, upon the realization that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. Furthermore, in order to leave an open access to reach conveniently the part oft he body on which the intervention is performed, the invention is concerned with assemblies that are compact and also do not incorporate ferromagnetic structures for the creation of return paths of the magnetic flux.

In accordance with this invention, permanent magnet assemblies, each formed from a plurality of annular concentric permanent magnets provide a volume of substantially uniform magnetic field extending from a central portion thereof.

The field strength of a single annular permanent magnet along a z-axis perpendicular to its face and passing through its center is given by the following expression, using the center of the permanent magnet as the origin of the coordinate system:

$$B(z) = \frac{\mu_0 \mu \Phi}{2} \left( \frac{z + h/2}{\sqrt{(z + h/2)^2 + b^2}} - \frac{z - h/2}{\sqrt{(z - h/2)^2 + b^2}} - \frac{z + h/2}{\sqrt{(z + h/2)^2 + a^2}} + \frac{z - h/2}{\sqrt{(z - h/2)^2 + a^2}} \right)$$

where:

$\mu_0$ is the permeability of air $\mu$ is the permeability of the annular permanent magnet $\Phi$ is the magnetization a is the inner radius of the annular permanent magnet b is the outer radius of the annular permanent magnet h is the height of the annular permanent magnet The uniformity of the magnetic field in the volume is based on the fact that any annular single permanent magnet has one point on its axis and located outside its own plane, of maximum or minimum field strength, so that the derivative of the field strength with respect to the z-axis there is zero (i.e. dB/dz=0). It has been realized that by displacing the upper surfaces of a plurality of concentric annular permanent magnets in the assembly from each other, the respective points of zero derivative can be displaced from each other, allowing the magnetic field in the volume to be made uniform to within a defined tolerance of superimposing each of the curves describing the field strength one on top of each other, so that the point of zero derivative of one curve is superimposed on top of the descending or ascending part of the other. In a like manner the upper surfaces themselves can be created with steps to provide additional displaced points of zero derivative.

The permanent magnet assemblies of this invention can be used in various ways. One way of use is to construct a single permanent magnet assembly by itself, to provide the uniform magnetic field adjacent to the upper surface thereof.

Figure 1:
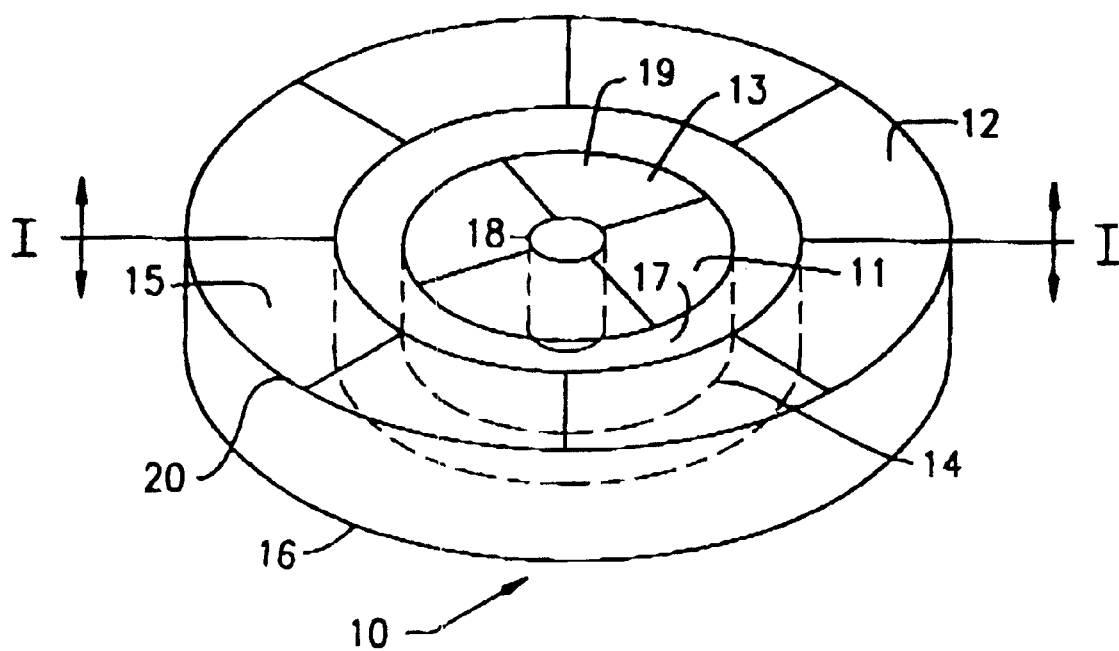
FIG. 1 is a pictorial perspective view of one segmented permanent magnet assembly according to the invention.
Figure 2:
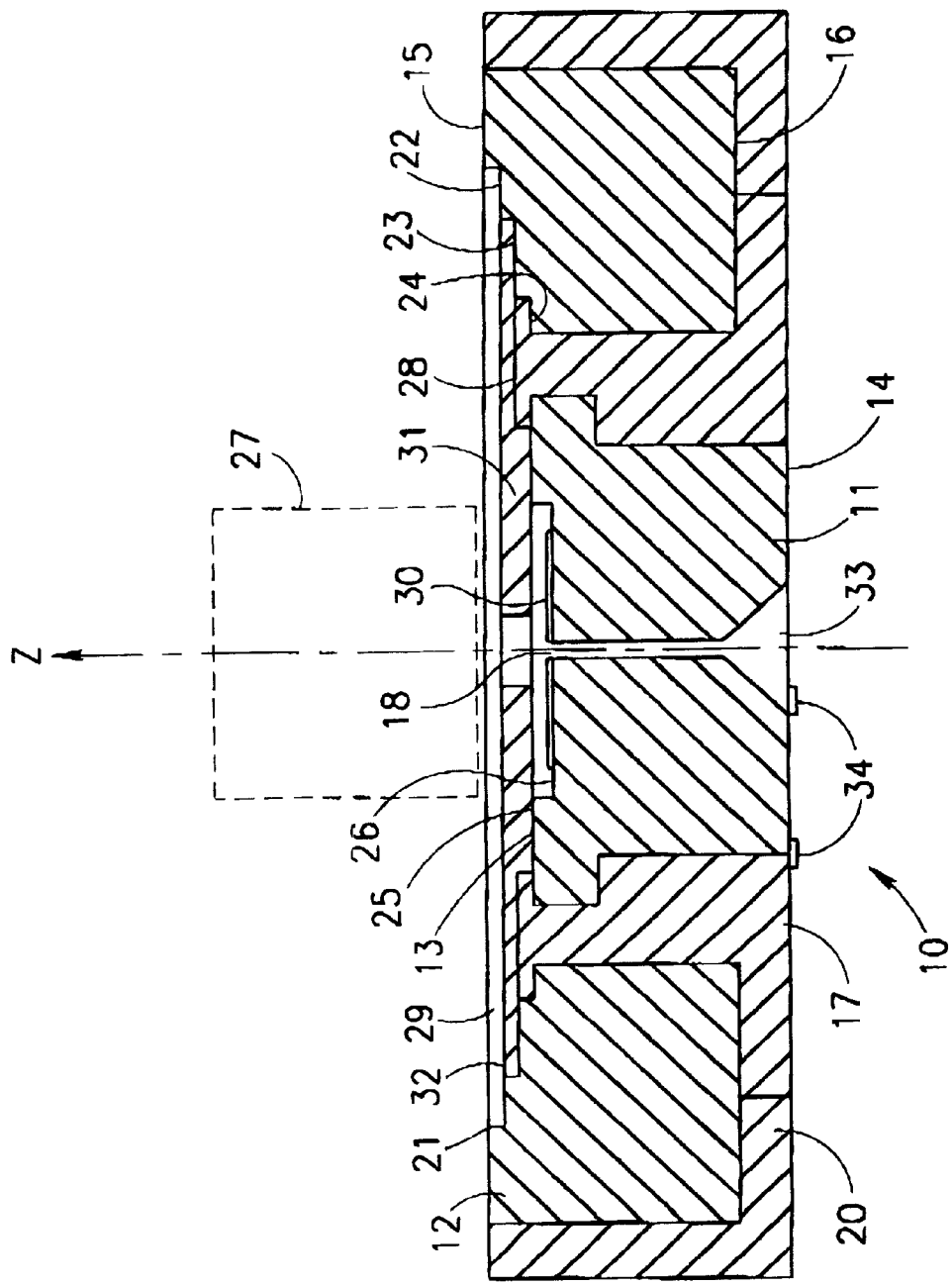
FIG. 2 is a half cross-sectional view through the line I—I in FIG. 1.

FIGS. 1 and 2, taken together, show pictorially one embodiment of the invention wherein a permanent magnet assembly 10 comprises inner and outer aligned annular permanent magnets 11 and 12 formed of Neodymium-Iron-Boron. The annular permanent magnets 11 and 12 are preferably concentric. The inner annular permanent magnet 11 has a first surface lying in a first plane and a second surface 14 lying in a different plane, each plane being parallel to the x-y plane of the permanent magnet assembly 10. The outer annular permanent magnet 12 has a surface 15 lying in a second plane and a second surface 16 lying in a different plane, each plane being parallel to the x-y plane of the permanent magnet assembly 10. The inner and outer annular permanent magnets 11 and 12 are interconnected by an intermediate annular band 17 of low permeability material which holds them with their north and south poles aligned in the same direction.

The complete structure comprising the inner annular permanent magnet 11, the outer annular permanent magnet 12 and the intermediate annular band 17 are supported by a support annular band 20 formed of low permeability material surrounding the outer annular permanent magnet 12. If desired, the support annular band 20 may be integral with the intermediate annular band 17, as shown in FIG. 2.

Referring particularly now to FIG. 2, a cross-section of the permanent magnet assembly 10 taken through the line I—I in FIG. 1, the first surface 15 of the outer annular permanent magnet is stepped such that a periphery 21 of the outer annular permanent magnet 12 is higher than successive intermediate portions 22, 23 and 24. Similarly, the first surface 13 of the inner annular permanent magnet 11 has a periphery 25 higher than an intermediate portion 26 thereof. The permanent magnet assembly 10 provides a volume 27 of substantially uniform magnetic field which is adjacent to its upper surface. Uniformity of the magnetic field in the volume 27 is based on the fact that any annular permanent magnet has one point where the derivative of the field strength with respect to the z-axis is zero (i.e. dB/dz=0), in a first direction perpendicular to the face of the magnet. In order to achieve the desired uniformity in the magnetic field of volume 27, the first surface 15 of the outer annular permanent magnet 12 is provided with steps 21, 22, 23, 24 and the first surface 13 of the inner annular permanent magnet 11 is provided with steps 25 and 26 constituting thereby a set of contiguous adjacent annular permanent magnets. Thus, each step produces an additional displaced point of zero derivative on the z-axis, riding on the ascending or descending parts of the curves describing the field strength generated by other steps. Consequently, the permanent magnet assembly 10 provides to the volume 27 a plurality of points for which dB/dz=0, such that the volume 27 of the magnetic field is substantially uniform.

A circular bore 18, its axis constituting the z-axis of the permanent magnet assembly 10, is formed in the inner annular permanent magnet 11 for allowing access from below therethrough of a medical instrument and for allowing an increased length of the medical instrument to protrude from the first surface 13 of the inner annular permanent magnet 11, when the permanent magnet assembly 10 is used in an MRT application. The circular bore 18 is provided with a conical recess 33 in the second surface 14 of the inner annular permanent magnet 11 of the permanent magnet assembly 10, for partially accommodating the medical instrument. Complete free access is allowed to the volume 27, when the volume is approached by the medical instrument from above.

In another embodiment of the invention, the inner annular permanent magnet 11 has a series of continuous steps such that the steps take the form of an incline. The incline is also possible on the steps of the outer annular permanent magnet 12.

Figure 3:
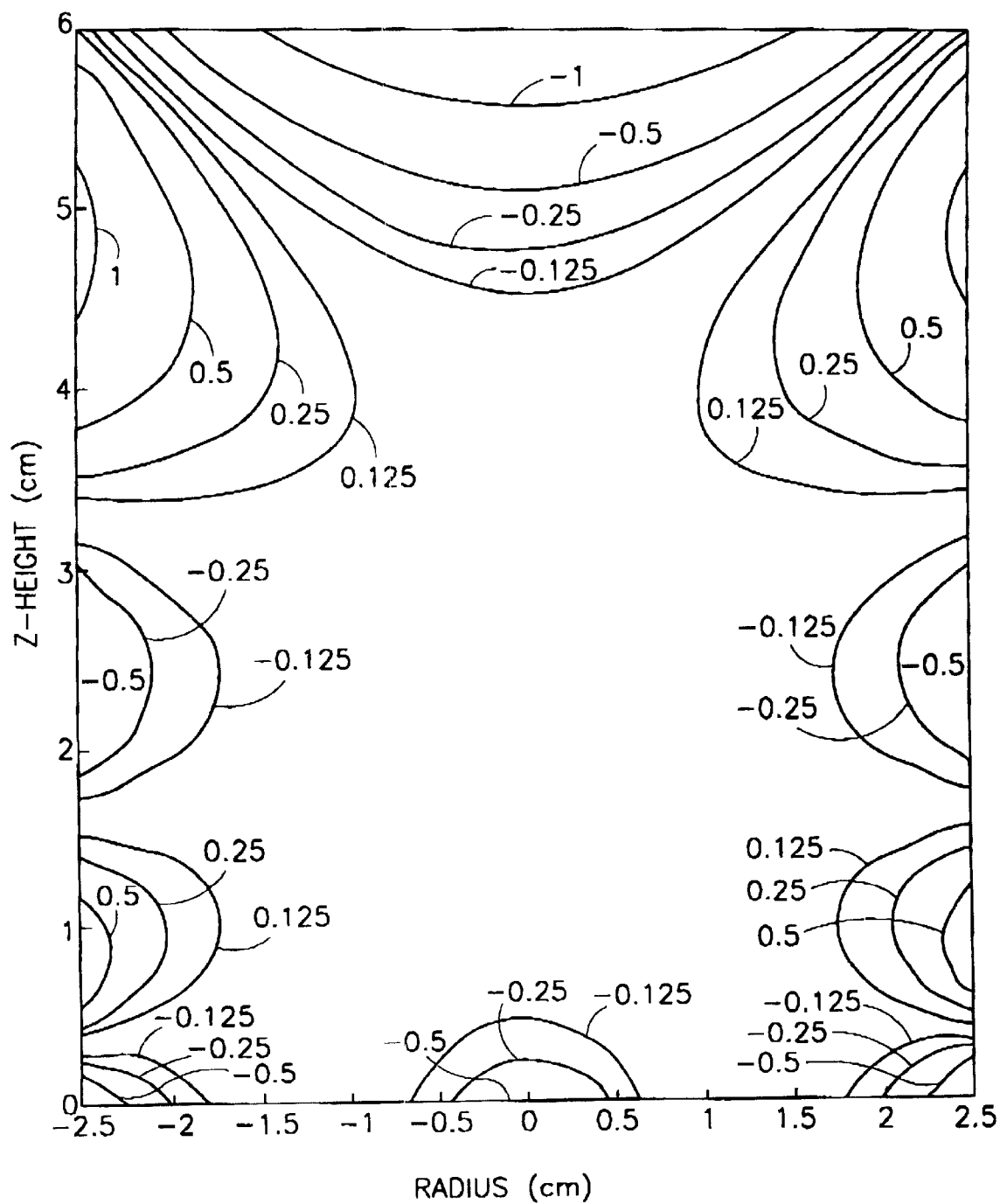
FIG. 3 is a representation of the two dimensional distribution of the magnetic field strength of the permanent magnet assembly of FIG. 1.

It has been found that a magnetic field with a uniformity of approximately 1000 ppm can be achieved prior to shimming, with a permanent magnet assembly 10 as shown in FIGS. 1 and 2. FIG. 3 shows the uniformity (in percentage) of the magnetic field generated by a 30 cm. diameter permanent magnet assembly. The volume 27 in which the uniformity is 1250 ppm or less is a cylinder adjacent to the upper face of the assembly 4.5 cm. in height, with a diameter of 2 cm. The field strength is 785 Gauss.

However, the uniformity of magnetic field strength of the volume 27 can be improved by means of shimming. There are standard shimming techniques, well-known to those skilled in the art of magnet design, referred to as passive shimming and active shimming.

Passive shimming can improve the magnetic field uniformity from orders of approximately 1000 ppm to order of approximately 100 ppm. Active shimming can improve the magnetic field uniformity from orders of approximately 100 ppm to orders of approximately 10 ppm and less.

Passive shimming is achieved by disposing shaped fragments 30 of magnetic material of various polarities, of mumetal, or of soft iron on, for example, the intermediate portion 26 of the inner annular permanent magnet 11 underneath a multi-layer printed circuit board 32.

Active shimming is achieved by printing shim coils 31 on several layers of the separate layers of the multi-layer printed circuit board 32, the other layers housing the gradient and RF coils, used ordinarily in MRI systems. The multi-layer circuit board is seated in the recess 29, which is defined by the area between the intermediate portion 23 of the outer annular permanent magnet 12, the first surface 28 of the intermediate annular band 17 and above the first surface 13 of the inner annular permanent magnet 11. The multi-layer printed circuit board 32 is thus above the intermediate portion 26 of inner annular permanent magnet 11 and does not touch it. The uniformity of the magnetic field may be further improved by disposing fragments 34 of magnetic material of various polarities, mumetal or soft iron on, for example, the second surface 14 of the inner annular permanent magnet 11.

In another embodiment of the invention not shown in the drawings, the support annular band 20 and the intermediate annular band 17 are shaped so as to allow the coaxial annular permanent magnets 11 an 12 to be finely displaced and mutually offset along the common z-axis, so as to achieve shimming. In this case, each of the coaxial annular permanent magnets 11 and 12 is connected to a low permeability lower plate via a plurality of radially spaced-apart adjustment screws, attached to and cooperating with the annular permanent magnets 11 and 12. Thus, the turning of the screws a small amount in either clockwise or counter-clockwise direction moves the corresponding annular permanent magnet (i.e. 11 or 12) toward or away from the low permeability lower plate and consequently corrects the non-uniformity in the volume 27 of uniform magnetic field to a desired degree.

The permeability of the annular permanent magnets 11 and 12, is temperature dependent so that temperature control can be a method of shimming. A deviation of 1° C. in the magnet temperature generates a change of 1000 ppm in the magnetic field strength. Each annular permanent magnet 11 and 12 has a temperature stabilization means for maintaining a substantially constant temperature of the respective permanent magnet and for varying it thereof for achieving shimming. The means consists of a heater and of a feedback circuit which controls the temperature.

It will be appreciated that modifications to the basic structure of the permanent magnet assembly 10 will be apparent to those skilled in the art, without departing from the spirit of the invention. For example, it is understood that other annular permanent magnet assemblies besides annular permanent magnets 11 and 12 may be employed. Also the size of the annular permanent magnets can vary according to the need.

Additional annular permanent magnets can be inserted between the inner and outer annular permanent magnets 11 and 12, preferably such that an intermediate support means of low permeability material is inserted between each adjacent annular permanent magnet. However, in the extreme embodiment where an external dimension of an internal annular permanent magnet is equal to an internal dimension of an adjacent, external annular permanent magnet, so that the two annular permanent magnets are contiguous, the permanent magnet assembly 10 behaves as though the two contiguous annular permanent magnets are a single structure. In either case, the desired volume 27 of uniform magnetic field is still achieved.

A common problem with magnets is the generation of eddy currents. Eddy currents are induced by momentarily changing the magnetic field as the gradient field is formed. The eddy currents in turn produce a separate magnetic field in the volume 27 of uniform magnetic field. In order to reduce eddy currents, both the inner and outer annular permanent magnets 11 and 12 are formed of segments 19, each of which is permanently magnetized in a known manner and then attached to a neighboring segment, using a non-conductive glue.

Further, it is possible that local heating could be problematic, thus the intermediate annular band 17 may be formed of high thermal conductivity material so as to dissipate heat and reduce heat buildup. In an embodiment where the intermediate annular band 17 is itself formed of electrically conductive material, it too may be slotted radially so as to reduce eddy currents.

Figure 4:
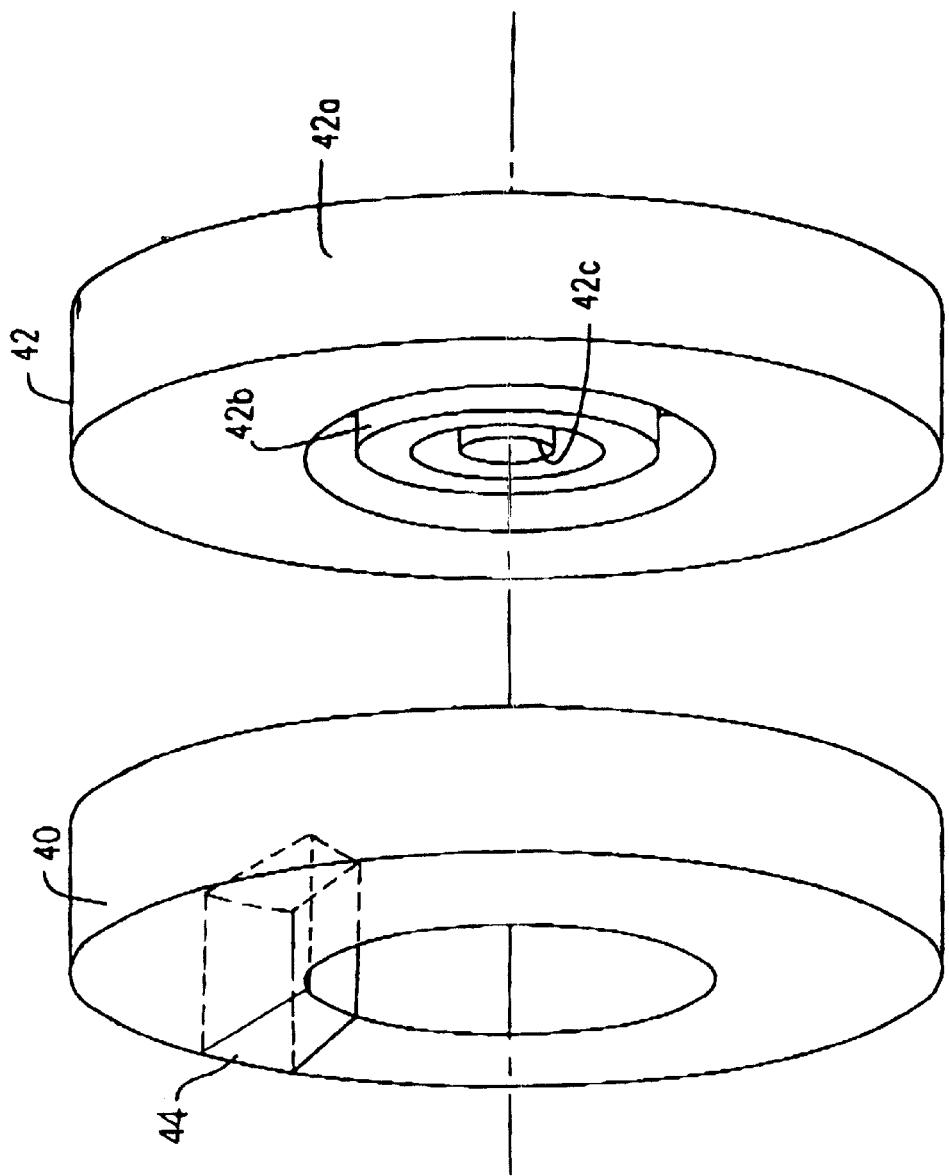
FIG. 4 is a pictorial representation of a first and a second permanent magnet assembly.

Another way to use the permanent magnet assemblies is in opposed pairs, to form the uniform magnetic field therebetween. FIG. 4 is a pictorial representation of a set of first and second permanent magnet assemblies 40 and 42 each consisting of three concentric annular permanent magnets 42a, 42b, 42c and 40a, 40b, 40c (not shown in the drawing). Each permanent magnet assembly is formed of segments 44, electrically insulated from a neighboring segment so as to reduce eddy currents.

Figure 5:
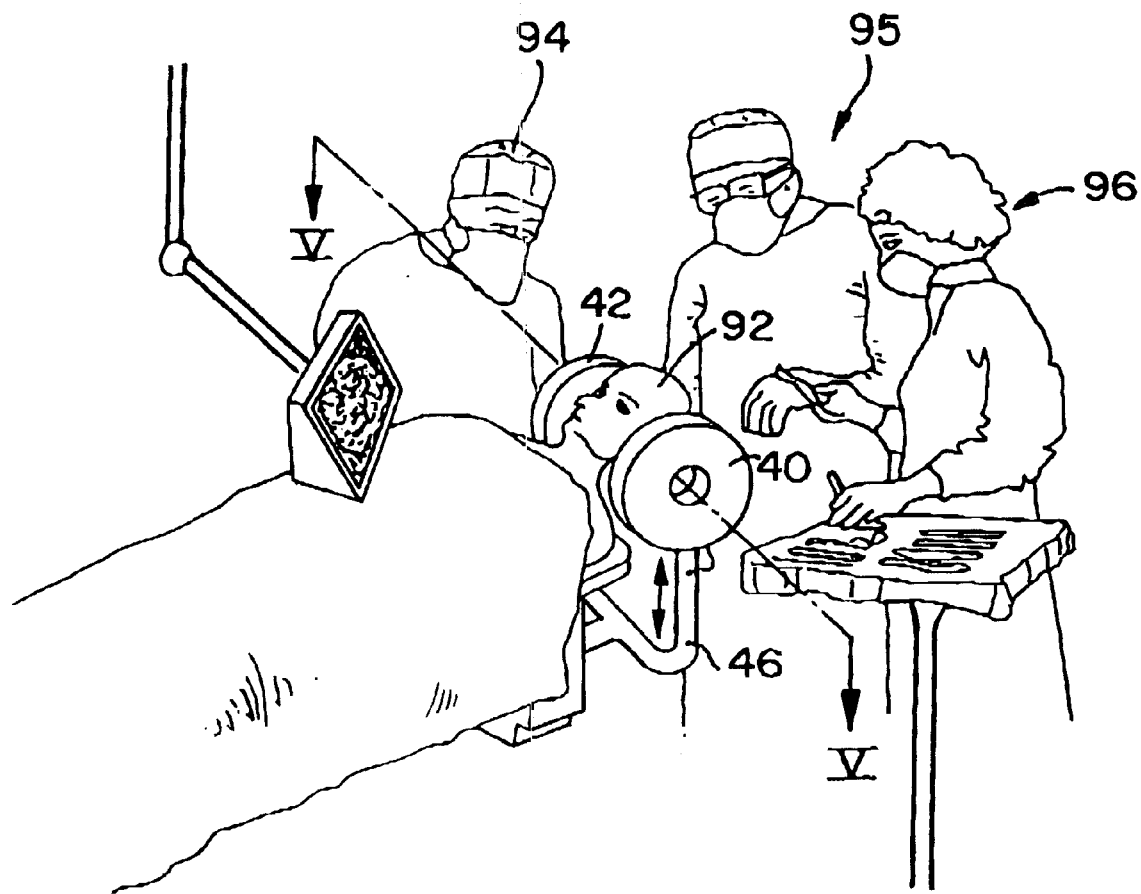
FIG. 5 is a pictorial perspective view of the first and second permanent magnet assemblies connected via a frame used for brain surgery.

FIG. 5 shows pictorially details of the pair of permanent magnet assemblies 40 and 42 joined together via the frame 46 being shaped for imaging a patient's brain 92, as manipulated by a plurality of surgeons 94 and 95 and a nurse 96. The pair of permanent magnet assemblies 40 and 42 joined together via a frame 46 define a region having a volume 27 of substantially uniform magnetic field, between the pair of permanent magnet assemblies 40 and 42.

Figure 6:
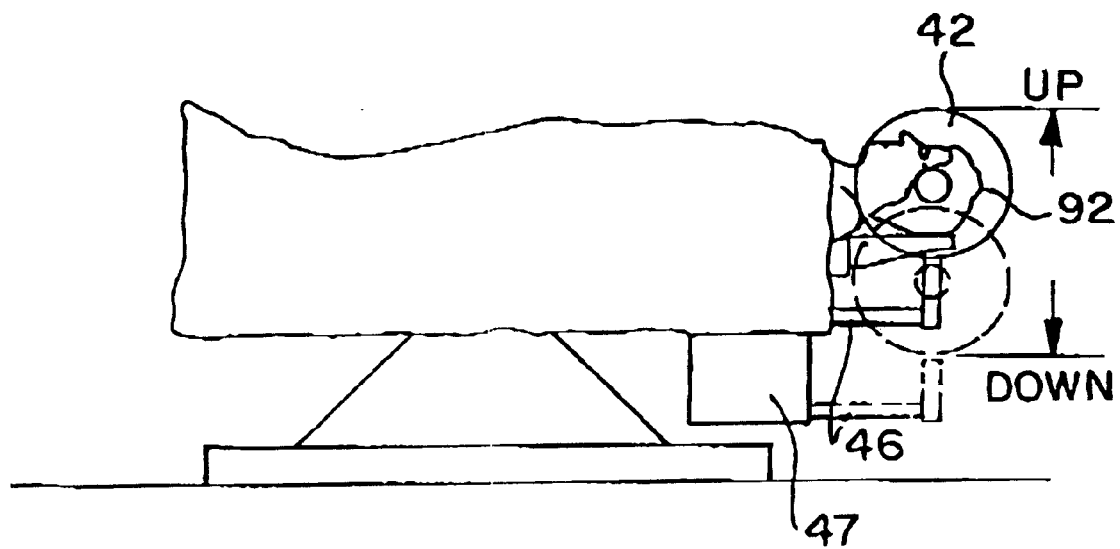
FIG. 6 is a pictorial perspective view of the first and second permanent magnet assemblies shown functionally in FIG. 5, used for performing composite imaging.

FIG. 6 is a pictorial side view of the pair of permanent magnet assemblies 40 and 42 connected via a frame 46, shown pictorially in FIG. 5, used for performing composite imaging. The pair of permanent magnet assemblies 40 and 42 may be moved as a whole in the three directions x, y, and z by a MRI compatible motor control unit 47, to shift the region of volume 27 of uniform magnetic field and thus perform MRI and/or MRT on different regions of the patient's brain 92. Thus, the volume 27 of uniform magnetic field is shifted in relation to a patient placed between the pair of permanent magnet assemblies 40 and 42. In use, the pair of permanent magnet assemblies 40 and 42 connected via the frame 46 is placed in a first position to produce a first image over a small field of view. The pair of permanent magnet assemblies 40 and 42 connected via the frame 46 is then moved by the motor control unit 47, for example in the up and down directions, so as to produce a series of spatially offset images. These separate spatially offset images are then combined to form a composite image, having a larger field of view.

Figure 7:
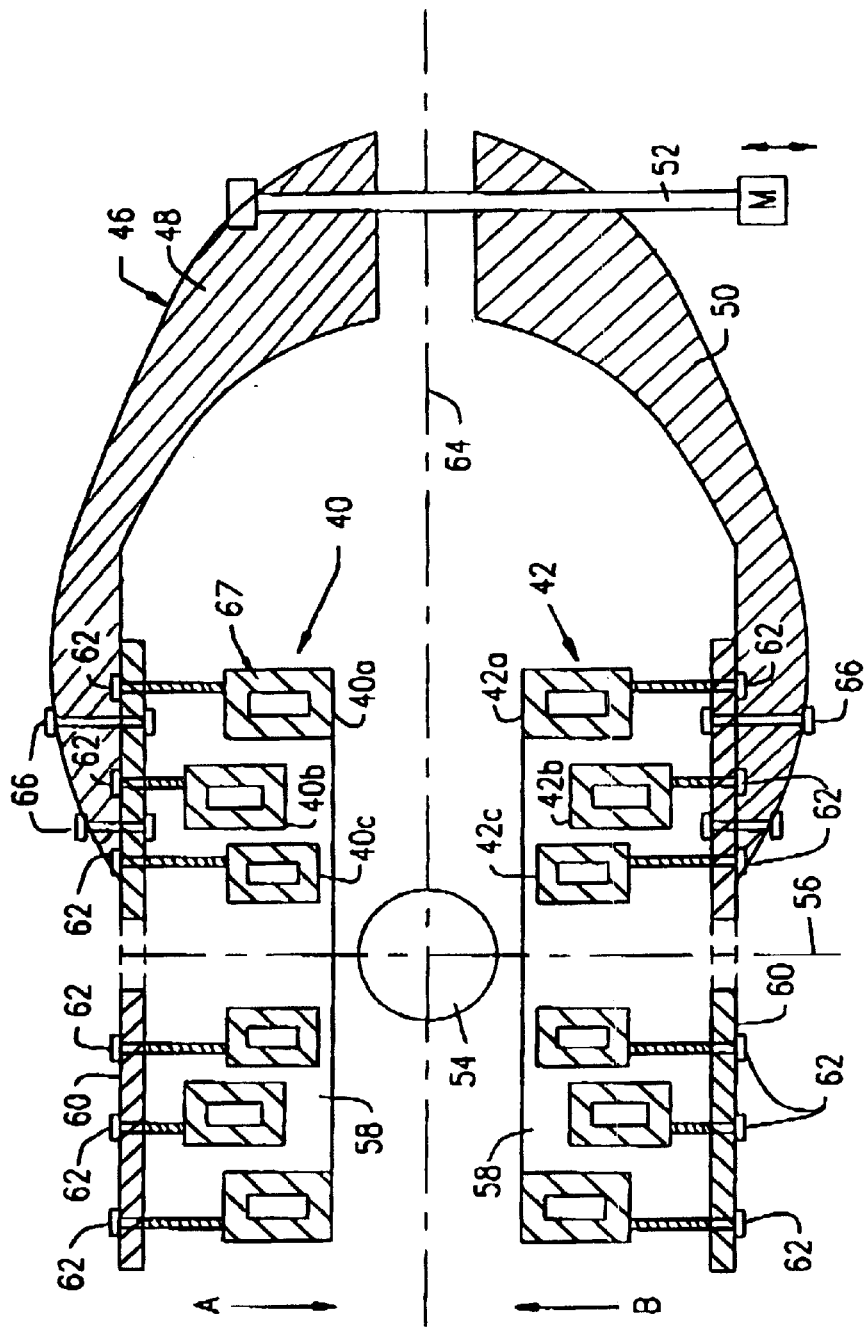
FIG. 7 is a cross-sectional view through the first and second permanent magnet assemblies and connecting means of FIG. 5.

FIG. 7 is a detailed cross-sectional view through the pair of permanent magnet assemblies 40 and 42 along the line V—V in FIG. 5. The frame 46 comprises a set of two symmetrically mounted jaws 48 and 50 joined at an end by a screw 52. An MRI compatible motor designated M is attached to the screw 52 to provide displacement of each of the permanent magnet assemblies 40 and 42 as a whole in an axial direction, to bring the permanent magnet assemblies 40 and 42 either close together or further apart, for shimming purposes.

Each of the permanent magnet assemblies 40 and 42 includes a plurality of coaxial annular permanent magnets 40a, 40b, 40c and 42a, 42b, 42c which are designed to provide the required volume 27 of uniform magnetic field within a region 54 between the pair of permanent magnet assemblies 40 and 42. Each of the annular permanent magnets 40a, 40b, 40c and 42a, 42b, 42c is enclosed in a low permeability material casing 67. It will be noted that FIG. 7 shows only three coaxial annular permanent magnets, for the sake of illustration and description.

Each of the coaxial annular permanent magnets 40a, 40b, 40c and 42a, 42b, 42c is coaxial with a common axis 56 of the corresponding pair or permanent magnet assemblies 40 and 42, respectively. However, the coaxial annular permanent magnets 40a, 40b, 40c and 42a, 42b, 42c themselves are mutually offset along the common axis 56.

The contribution of each annular permanent magnet to the overall field strength combines to generate a plurality of locations of zero derivative in the z-direction allowing the magnetic field in the volume to be made uniform to within a defined tolerance. The overall field strength along the z-axis 56 of each permanent magnet assembly 40 and 42 is given by:

$$B(z) = \frac{\mu_0 \Phi}{2} \sum_i \mu_i \left( \begin{array}{c} \frac{\Delta z_i + h_i/2}{\sqrt{(\Delta z_i + h_i/2)^2 + b_i^2}} - \frac{\Delta z_i - h_i/2}{\sqrt{(\Delta z_i - h_i/2)^2 + b_i^2}} \\ -\frac{\Delta z_i + h_i/2}{\sqrt{(\Delta z_i + h_i/2)^2 + a_i^2}} + \frac{\Delta z_i - h_i/2}{\sqrt{(\Delta z_i - h_i/2)^2 + a_i^2}} \end{array} \right)$$

where:

$\Delta_{zi} = Z - z_{0i}$ is the transverse separation, along the symmetry axis 56, of z and $z_{0i}$, a point located midway between the upper and lower surfaces of the $i^{th}$ annular permanent magnet $\Phi$ is the magnetization $\mu_0$ the permeability of air $\mu_i$ is the permeability of the $i^{th}$ annular permanent magnet $\alpha_i$ is the inner radius of the $i^{th}$ annular permanent magnet $b_i$ is the outer radius of the $i^{th}$ annular permanent magnet $h_i$ is the height of the $i^{th}$ annular magnet the direction of the z axis for each permanent magnet assembly is towards the volume 27 of uniform magnetic field. The overall field strength is a superposition of the field strengths generated by each assembly.

Each of the coaxial annular permanent magnets 40a, 40b, 40c and 42a, 42b, 42c is fixed to an outer casing 60 via a plurality of radially spaced apart set screws 62, attached to the magnets enclosures 67, cooperating with the respective coaxial enclosures 67 of the annular permanent magnets 42a, 42b, and 42c, for achieving shimming of the permanent magnet assembly 42. It is apparent, as noted above, that the coaxial annular permanent magnets 42a, 42b, 42c are mutually offset along the common axis 56 so as to achieve shimming. Thus, turning of the set screws 62 a small amount in either clockwise or counter-clockwise direction moves the corresponding coaxial annular permanent magnet (i.e. 42a, 42b, 42c etc.) toward or away from the outer casing 60 of the permanent magnet assembly 42 and consequently corrects the non-uniformity in the region 54 of volume 27 of uniform magnet field to a desired degree.

The free end of the jaws 48 and 50 is fixed to the outer casing 60 of the permanent magnet assemblies 40 and 42 by means of a plurality of fixing bolts 66. The whole structure 46 can be translated along the x, y and z axis by the motor control unit 47 (not shown). Moreover, each of the jaws 48 and 50 may be rotated away from its opposing jaw by the motor control unit 47, around an axis passing along screw 52, to allow the surgeon to have complete free access to one side of the patient. The bolts 66 may also be displaced, so that the respective pair of permanent magnet assemblies 40 and 42 may be moved in the direction of arrows A and B and thus accomplish shimming.

Figure 8:
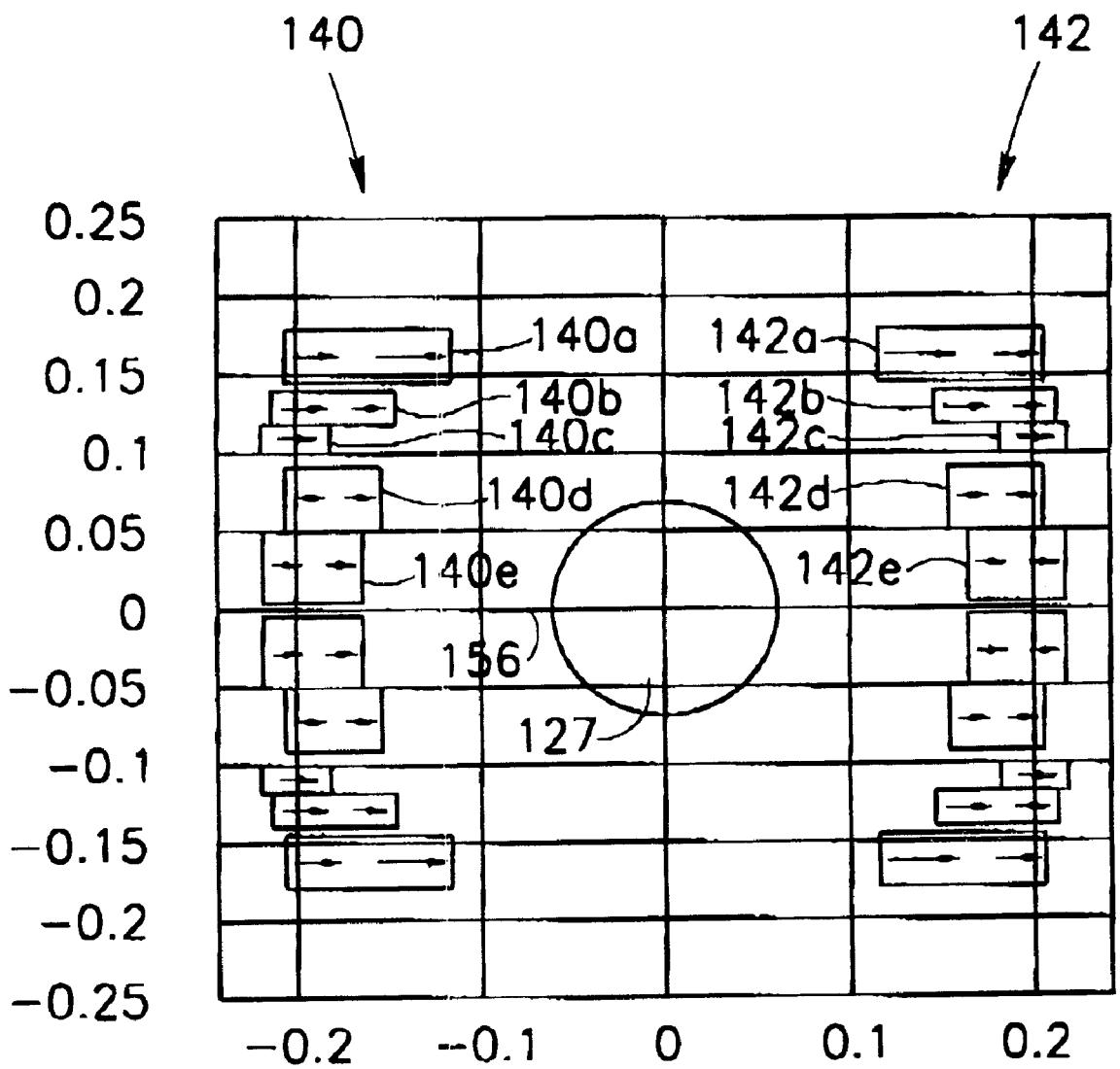
FIG. 8 is a schematic representation of first and second permanent magnet assemblies in which each permanent magnet assembly has five annular ring magnets.

FIG. 8 is a schematic representation of an embodiment of the invention including five coaxial annular permanent magnets 140a, 140b, 140c, 140d, 140e and 142a, 142b, 142c, 142d, 142e of the pair of permanent magnet assemblies 140 and 142. The dimensions of the five coaxial annular permanent magnets are shown in meters. The magnetic polarity of the coaxial annular permanent magnets creates a volume 127 of homogenous magnetic field.

Inasmuch as the pair of permanent magnet assemblies 140 and 142 are identical in the embodiment thus far as described in FIG. 7, only one permanent magnet assembly containing five coaxial annular permanent magnets will be described in detail. However, it is understood that the pair of permanent magnet assemblies 140 and 142 need not be identical. Rather, the pair of permanent magnet assemblies 140 and 142 can have an unequal number of annular permanent magnets.

Thus, in FIG. 8, the coaxial annular permanent magnets 140, 140b, 140c, 140d, 140e in the permanent magnet assembly 140 may be finely displaced for shimming either towards or away from the complementary coaxial annular permanent magnets 142a, 142b, 142c, 143d, and 142e in the opposing permanent magnet assembly 142 along the common axis 156. An air gap of approximately 5 millimeters is provided between the adjacent coaxial annular permanent magnets 140a and 140b with an increased air gap of approximately 10 millimeters provided between the adjacent coaxial annular permanent magnets millimeters 140c and 140d. The remaining adjacent coaxial annular permanent magnets 140b, 140c and 140d, 140e are contiguous. Further, the overall average displacement between the pair of permanent magnet assemblies 140 and 142 is approximately 25 cm. and their approximately radius is 18 cm. The two opposing magnets weigh together 120 kg. The diameter of the spherical volume 127 of uniform magnetic field is 16 cm.

Figure 9:
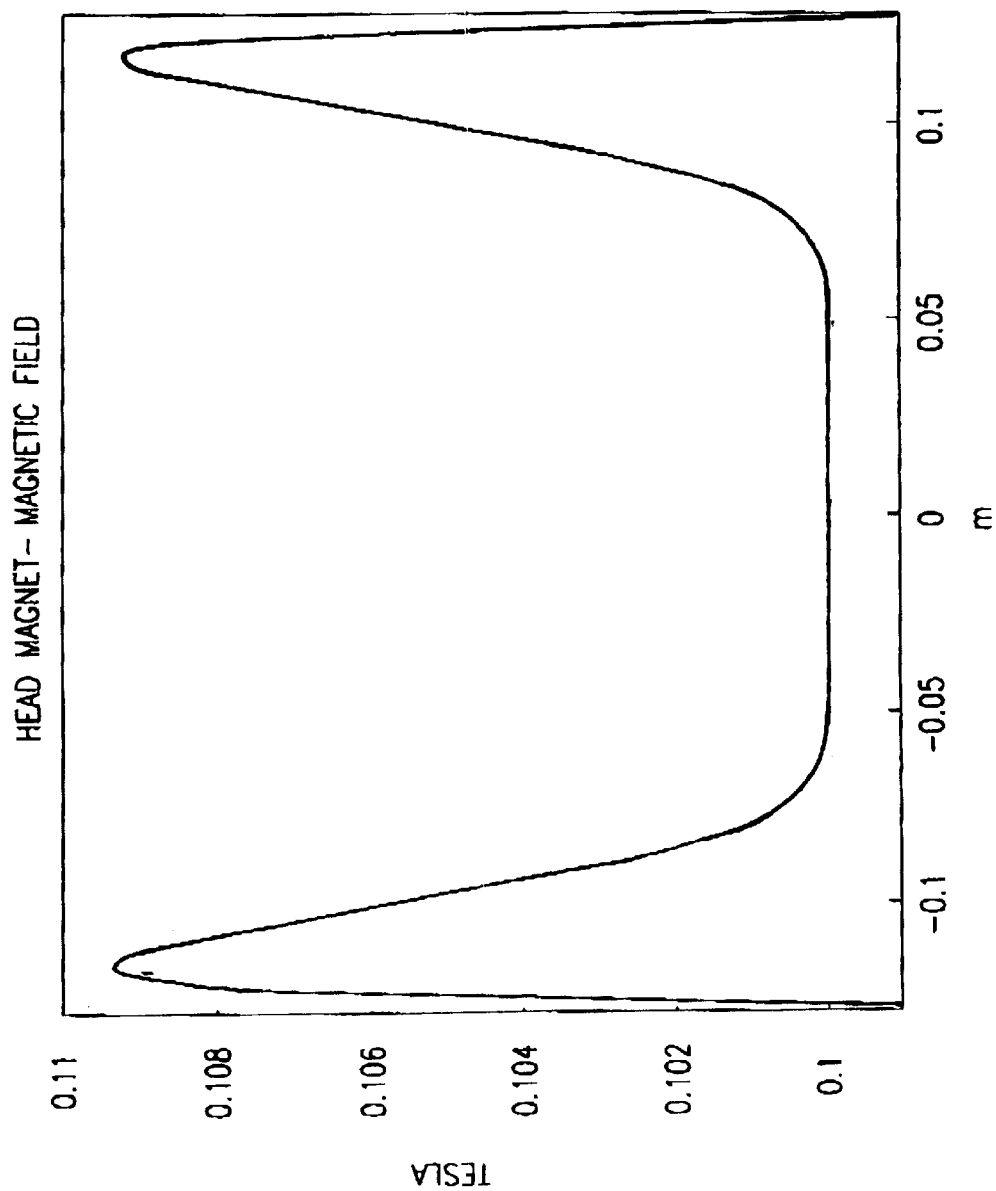
FIG. 9 is a graph showing the magnetic field strength as a function of displacement along the z-axis between the first and second permanent magnet assembly of FIG. 8.
Figure 10:
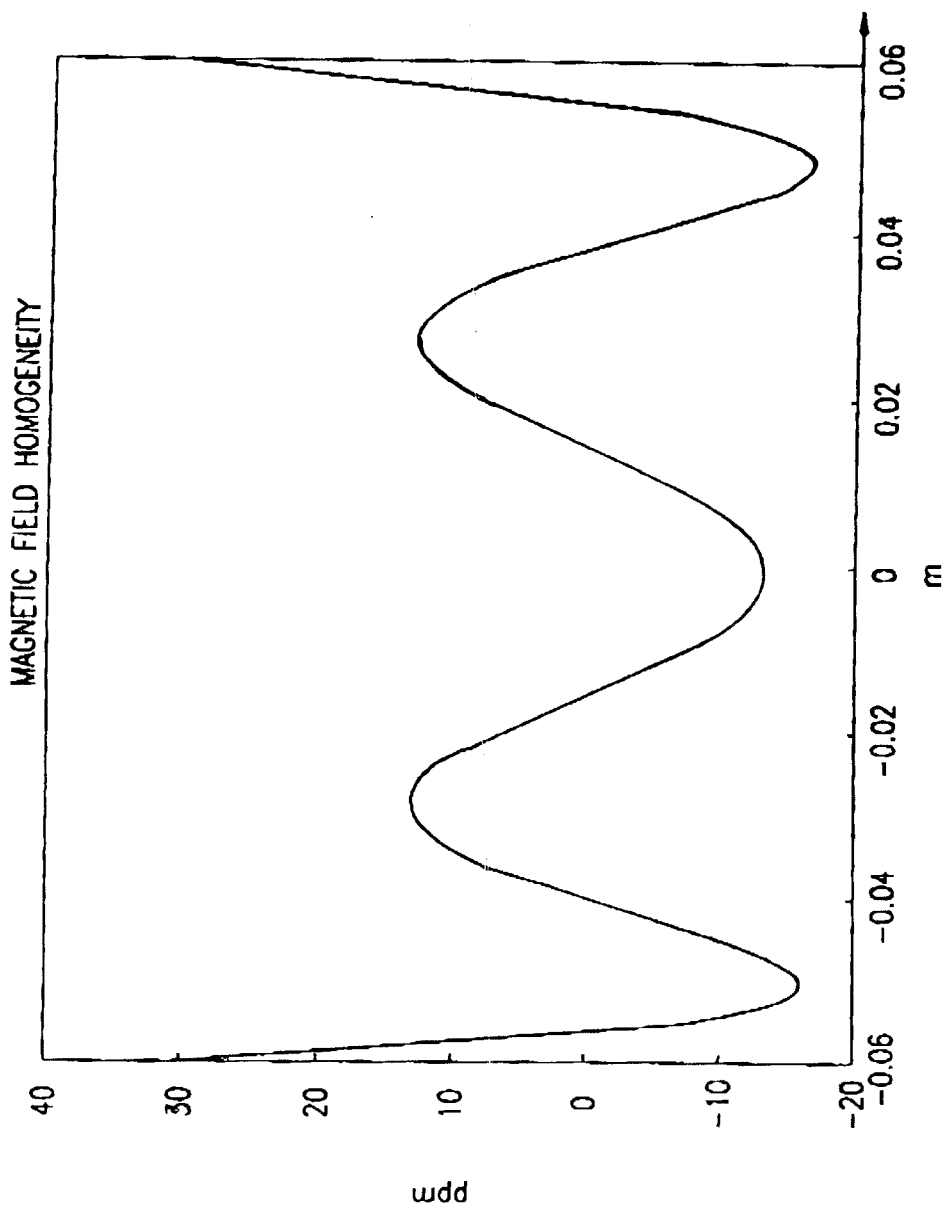
FIG. 10 is a graphical representation showing the deviation from uniform magnetic field along the z-axis between the first and second permanent magnet assembly of FIG. 8.

FIG. 9 is a graph showing magnetic field strength as a function of displacement along the z-axis, at a given value of y. It is seen that the field strengths of the opposing permanent magnet assemblies 40 and 42 superimpose so as to form a region 54 of a volume 27 of substantially homogenous magnet field having a magnitude of approximately 1000 Gauss. FIG. 10 is a graphical representation of the magnetic field in volume 27 along the z-axis, showing the uniformity in ppm. The effect of superposition of curves having spaced apart maxima is illustrated.

As noted above, a particular design features of the permanent magnet assembly 10 is the ease with which shimming may be used to achieve a volume 27 of very high magnetic field uniformity typically to within several ppm.

Figure 11:
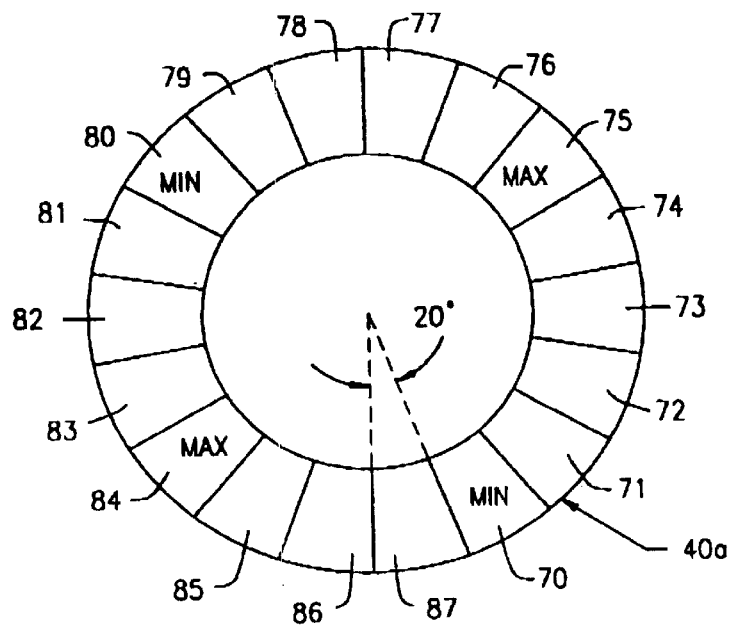
FIG. 11 shows schematically a detail of the segmented construction of the first and second permanent magnet assemblies, according to a preferred embodiment of the invention.

FIG. 11 shows schematically a detail of the construction of the coaxial annular permanent magnet 40a. Each coaxial annular permanent magnet comprises eighteen permanently magnetized segments 70 to 87 which are supplied in batches and are normally guaranteed by the manufacturer to have a peak to peak variation in magnetic field of 1%. The segments 70 to 87 each subtend an angle of 200 at the center of the coaxial annular permanent magnet 40a and are joined by an electrically non-conductive adhesive so as to reduce eddy currents, as explained above.

Owing to the slight difference in magnetic field between different segments 70 to 87 in each batch, it is often difficult to achieve a volume 27 of even a coarse magnetic field uniformity in the region 54 between a pair of opposing permanent magnet assemblies 40 and 42. It will be understood that at least a coarse magnetic field uniformity is a prerequisite to the fine tuning achieved using passive and active shimming.

Figure 12A:
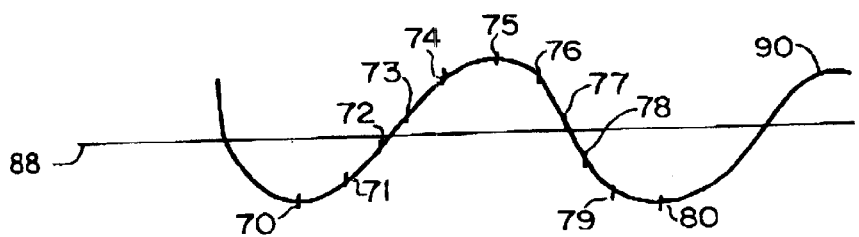
FIGS. 12a and 12b show graphically a preferred mutual disposition of opposing first and second permanent magnet assemblies having complementary magnetic field variations.
Figure 12B:

FIGS. 12a and 12b show graphically how such a volume 27 of coarse magnetic field uniformity is achieved, notwithstanding the inherent variation in magnetic field of different segments 70 to 87. The magnetic field of different segments 70 to 87 is measured and adjacent segments are selected from the batch having slightly different field strengths so as to follow a substantially cyclic curve 90. Thus, as shown in FIGS. 11 and 12a, the particular segments 70 and 80 have a minimum magnetic field as compared to segment 85 which has a maximum magnetic field. The segments from 70 to 75 have increasing magnetic fields following the cyclic curve 90 in contrast to segments from 75 to 80 which have decreasing magnetic fields following the cyclic curve 90. Each of the pair of permanent magnet assemblies 40 and 42 is constructed according to this approach and are then opposed to one another in anti-phase such that the relationship of the corresponding magnetic fields of the pair of permanent magnet assemblies 40 and 42 corresponds to the two anti-phase cyclic curves shown in FIGS. 12a and 12b. The variations in magnetic field from its average value as described by lines 88 and 89 along the two cyclic curves then exactly cancel each other out, such that a region 54 between the pair of permanent magnet assemblies 40 and 42 has a volume 27 of uniform magnetic field.

It will be appreciated that, due the limited magnetic field magnitude achievable by using commercially available permanent magnets (such as, for example, Neodymium-Iron-Boron magnets), the magnitude of the substantially uniform magnetic field which is typically achievable within the imaging volume of such permanent magnetic probes is within the range of approximately 0.1–0.3 Tesla (1000–3000 Gauss). However, in many cases it is desirable to increase the magnitude of the magnetic field within the imaging volume. Increasing the magnitude of the magnitude field improves the signal to noise ratio (S/N) which improves image resolution and enables reducing the time required for image acquisition. The latter may be particularly advantageous for inter-operative MRI in which it is desirable to minimize the time required for image acquisition during the performance of surgery on a patient.

Trying to increase the magnitude of the magnetic field within the imaging volume by designing larger permanent magnet assemblies has practical limits since increasing the size of the annular permanent magnets is relatively inefficient because the intensity of the magnetic field is inversely proportional to the third power of the distance of the magnetic material from the imaging volume. Therefore, adding additional annular permanent magnets of larger diameters has a practical limit due to the prohibitive cost of the magnetic material. Additionally, increasing the diameter of the permanent magnet assemblies beyond a certain size is not desirable because it may limit access to the imaged organ or body part during surgery.

Figure 15:
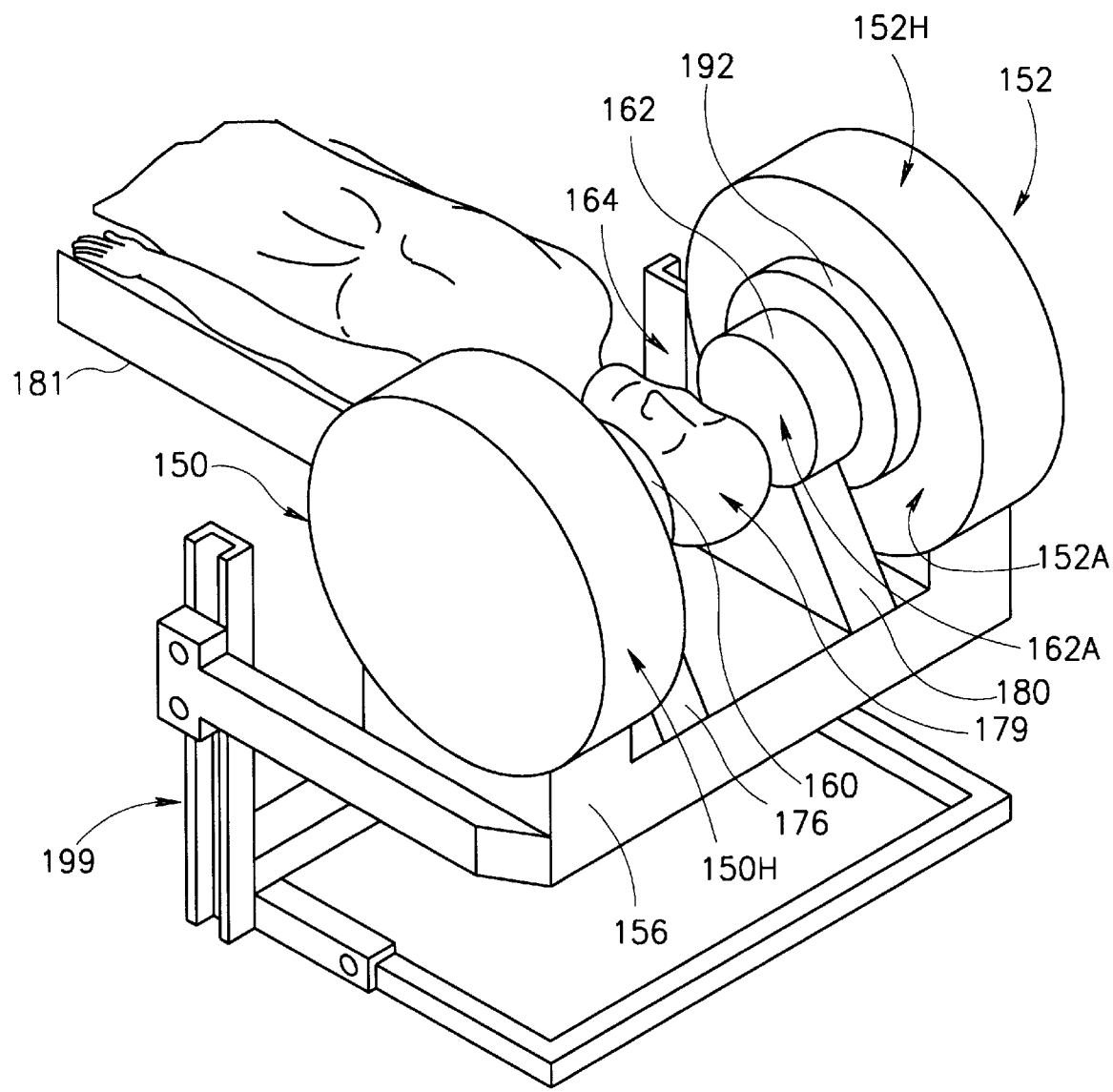
FIG. 15 is an isometric view illustrating the hybrid magnetic apparatus of FIG. 13 attached to a motorized gantry with a head of a patient disposed in the open region of the apparatus in a position suitable for imaging.

Reference is now made to FIGS. 13–15. FIG. 13 is a schematic diagram illustrating a front view of an open hybrid magnetic apparatus for MRI/MRT including an electromagnet flux generator and permanent magnet assemblies, in accordance with another preferred embodiment of the present invention. FIG. 14 is a cross sectional view of the hybrid magnetic apparatus of FIG. 13, taken along the lines XIV—XIV. FIG. 15 is an isometric view illustrating the hybrid magnetic apparatus of FIG. 13 attached to a motorized gantry with a head of a patient disposed in the open region of the apparatus in a position suitable for imaging.

The magnetic apparatus 150 of FIG. 13 includes an electromagnetic flux generator including two opposing electromagnet assemblies 150 and 152. The electromagnet assemblies 150 and 152 include housings 150H and 152H, respectively. The housings 150H and 152H are attached to a base member 156. The electromagnet assemblies 150 and 152 are generally cylindrically shaped and are spaced apart from each other. However, the electromagnet assemblies 150 and 152 may have any other suitable shape depending, inter alia, on the type and detailed design of the electromagnet assemblies used, the type and arrangement of electromagnet coils (not shown) included in the electromagnet assemblies 150 and 152 and on the detailed design of the housings 150H and 152H as disclosed in detail hereafter. The housing 150H has an internal, surface 150A and the housing 152H has an internal surface 152A. The internal surface 150A faces the internal surface 152A.

The magnetic apparatus 150 further includes two opposing permanent magnet assemblies 160 and 162. The permanent magnet assemblies 160 and 162 are attached to the base 156 by two mounting members 176 and 180, respectively. The permanent magnet assembly 160 has an inner surface 160A and an outer surface 160B. The permanent magnet assembly 162 has an inner surface 162A and an outer surface 162B. The inner surfaces 160A and 162A define an open region 164 therebetween, an imaging volume 177 is positioned within the open region 164. The dashed line 175 represents the line of intersection of a mid-plane (not shown) with the plane in which the cross section of FIG. 13 lies (represented by the plane of the page of the drawing of FIG. 13). The mid-plane is equidistant from the surfaces 160A and 162A. The mid-plane is also equidistant from the surfaces 150A and 152A of the housings 150H and 152H, respectively.

The magnetic apparatus 150 further includes two opposing gradient coil assemblies 190 and 192. The gradient coil assembly 190 is disposed between the surface 150A of the housing 150H and the outer surface 160B of the permanent magnet assembly 160. The gradient coil assembly 192 is disposed between the surface 152A of the housing 152H and the outer surface 162B of the permanent magnet assembly 162. Each of the gradient coil assemblies 190 and 192 may include an x-gradient coil a y-gradient coil and a z-gradient coil and may be constructed similar to the multi-layer printed circuit assemblies disclosed in detail by Zuk et al. and illustrated in FIGS. 5–8 of U.S. patent application Ser. No. 09/161,336. The gradient coil assemblies 190 and 192 are disposed outside of the open region 164 which increases the space available within the open region 164 as disclosed in detail in U.S. patent application Ser. No. 09/161,336.

It is noted that, the gradient coil assemblys' structure and positioning may be any suitable structure and positioning which is known in the art including, but not limited to, all the different structures and arrangements of gradient coils or gradient coil combinations (or gradient coil pair arrangements) disclosed in detail in U.S. patent application Ser. No. 09/161,336 to Zuk et al.

Similarly, the transmitting and receiving RF coils (not shown) which are used for imaging with the magnetic apparatus 150 of the present invention, may have any suitable known structure and spatial position which is known in the art of RF coils including, but not limited to, all the different structures and arrangement of RF coils disclosed in detail in U.S. patent application Ser. No. 09/161,336 to Zuk et al.

Each of the permanent magnet assemblies 160 and 162 includes a plurality of generally annular or disc-like permanent magnets (not shown in FIG. 13 for the sake of clarity of illustration). The line 188 of FIG. 13 represents the common axis passing through the geometrical center of all of the annular permanent magnets of the permanent magnet assemblies 160 and 162 (and through the geometrical center of the disc-like permanent magnets if they are included in the permanent magnet assemblies 160 and 162) as disclosed in detail hereinbelow (see FIG. 16). The axis 188 is also defined as the z-axis of the hybrid magnetic apparatus 150. The main magnetic field generated by the magnetic apparatus 150 within the imaging volume 177 is directed in parallel to the z-axis 188.

The structure and arrangement of the permanent magnets composing the permanent magnet assemblies 160 and 162 has been disclosed in detail hereinabove and in U.S. patent application Ser. No. 09/161,336, to Zuk et al. In accordance with a preferred embodiment of the present invention, the shape and arrangement of the annular permanent magnets of permanent magnet assembly 160 may be similar to the shape and arrangement of the annular permanent magnets 40*a,* 40*b* and 40*c* of permanent magnet assembly 40 of FIGS. 4–7 and the shape and arrangement of the annular permanent magnets of permanent magnet assembly 162 may be similar to the arrangement of the annular permanent magnets 42*a,* 42*b* and 42*c* of permanent magnet assembly 42 of FIGS. 4–7.

In accordance with another preferred embodiment of the present invention, the shape and arrangement of the annular permanent magnets of permanent magnet assembly 160 may be similar to the shape and arrangement of the annular permanent magnets 140*a,* 140*b* and 140*c* of permanent magnet assembly 140 of FIG. 8 and the shape and arrangement of the annular permanent magnets of permanent magnet assembly 162 may be similar to the arrangement of the annular permanent magnets 142*a,* 142*b* and 142*c* of permanent magnet assembly 142 of FIG. 8.

In accordance with yet another preferred embodiment of the present invention, each of the permanent magnet assemblies 160 and 162 may be constructed similar to the permanent magnet assembly 10 of FIGS. 1–2, with the proviso that the permanent magnet assemblies 160 and 162 are arranged within the apparatus 150 such that the permanent magnet assembly 160 is oriented as a mirror image of the permanent magnet assembly 162 with respect to the mid-plane (not shown) equidistant from the surfaces 150A and 152A of the electromagnet assemblies 150 and 152, respectively. However, The orientation of magnetization of the two annular permanent magnets included within any of the complementary opposing pairs of the annular permanent magnets of the permanent magnet assemblies 160 and 162 are identical, while different pairs of opposing complementary annular permanent magnets may have their magnetization directions oriented parallel or anti parallel to each other, depending on the specific design of the magnetic assemblies as disclosed in detail hereinabove and illustrated in FIG. 8. And as disclosed in detail by Zuk et al. in U.S. patent application Ser. No. 09/161,336.

In accordance with yet another preferred embodiment of the present invention, the permanent magnet assemblies 160 and 162 may be constructed similar to the permanent magnet assemblies disclosed in U.S. patent application Ser. No. 09/161,336, to Zuk et al.

Figure 16:
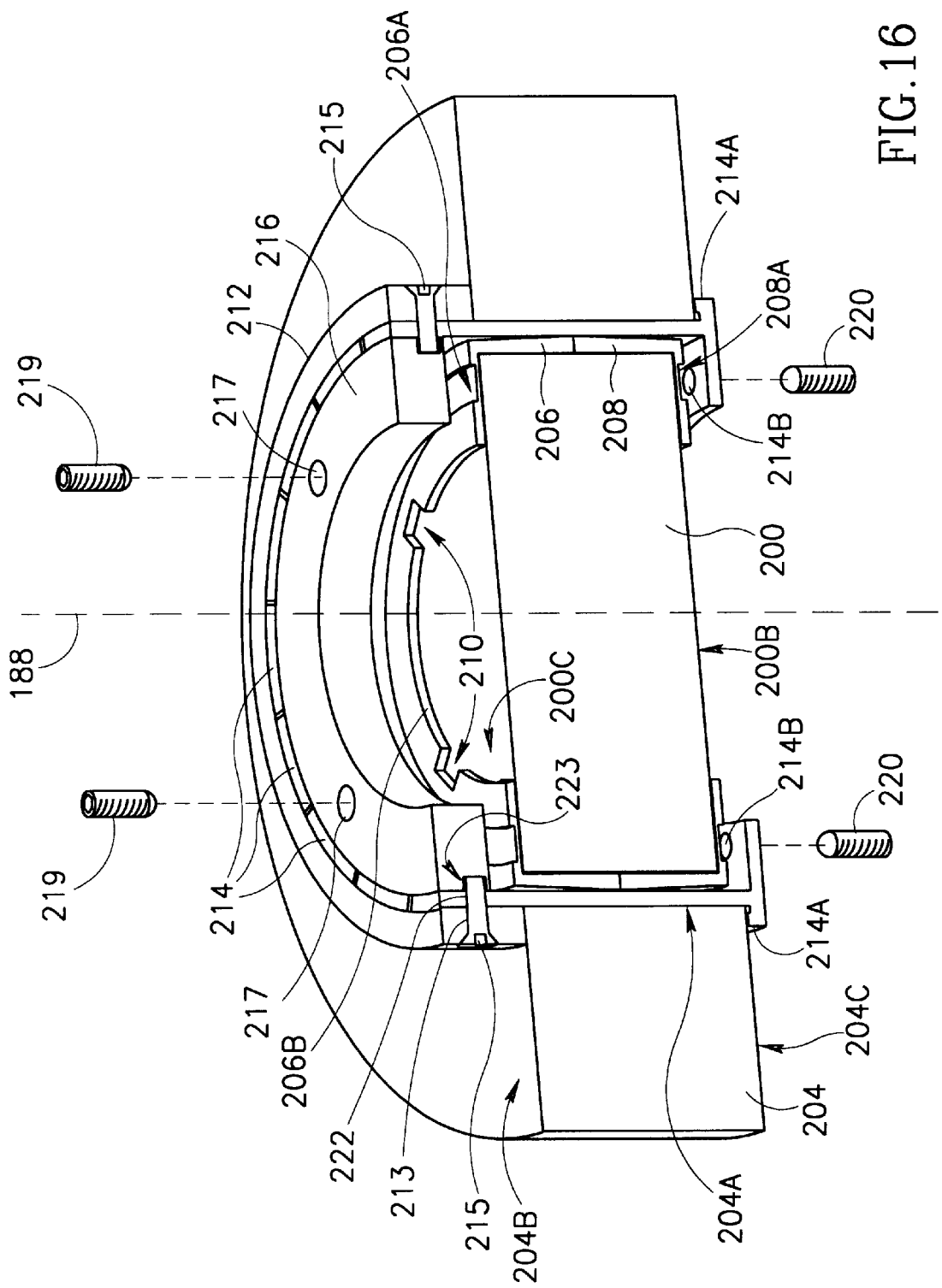
FIG. 16 is a part isometric, part cross-sectional exploded diagram illustrating a part of one of the permanent magnet assemblies of FIG. 13 in detail.

Reference is now made to FIG. 16 which is a part isometric, part cross-sectional exploded diagram illustrating a part of the permanent magnet assembly 160 of FIG. 13 in detail. The magnet assembly 160 includes a first disc-like permanent magnet 200 having an inner surface 204B and an outer surface 204C, and a second annular permanent magnet 204 having an inner surface 200B and an outer surface 200C. The z-axis 188 passes through the geometrical center of the permanent magnets 200 and 204 which are concentrically arranged with respect to the z-axis 188. The surfaces 200B and 200C are parallel surfaces and are substantially perpendicular to the z-axis 188. The surfaces 204B and 204C are parallel surfaces and are also substantially perpendicular to the z-axis 188. The magnet assembly 160 also includes two magnet protecting members 206 and 208. The magnet protecting members 206 and 208 are attached or glued to the first permanent magnet 200 and are preferably made from a non-ferromagnetic, and preferably non-electrically conducting material such as plastic, fiberglass or the like, but other suitable materials may also be used. The magnet protecting members 206 and 208 have annular notches 206A and 208A, respectively, therewithin. The magnet protecting member 206 has a plurality of rectangular notches 210 therein which are distributed along the inner circumference 206B thereof.

The magnet assembly 160 also includes an outer supporting ring-like member 212 and an inner ring-like supporting member 216. The supporting members 212 and 216 are preferably made from non-ferromagnetic, electrically non-conducting material such as, plastic, fiberglass or the like, but other suitable materials may also be used. The outer supporting member 212 is attached to the annular permanent magnet 204 by a suitable glue or by other suitable attaching means known in the art. The outer supporting member 212 has a plurality of circumferential threaded holes 213 therewithin. The holes 213 are adapted to receive a plurality of retaining screws 215 therein. The outer supporting member 212 has a second plurality of threaded holes 217 therewithin. The threaded holes 217 are adapted to receive a plurality of upper offsetting screws 219 therewithin.

The magnet assembly 160 further includes a plurality of L-shaped members 214 and 214A. The L-shaped members 214 and 214A are disposed between. A portion of each one of the L-shaped members 214 and 214A is disposed between the outer supporting member 212 and the inner supporting member 216. The retaining screws 215 are used to firmly attach the L-shaped members 214 and 214A to the outer and inner supporting members 212 and 216, respectively by screwing them into the threaded holes 213 and into suitable threaded holes 222 passing within the L-shaped members 214 and 214A, and through suitable threaded holes 223 within the inner supporting member 216.

Another different portion of each one of the L-shaped members 214 and 214A is disposed between the inner surface 204A of the annular permanent magnet 204 and the magnet protecting members 206 and 208. The L-shaped members 214 and 214A are preferably made from a non-ferromagnetic electrically non-conducting material such as, plastic, fiberglass or the like, but other suitable materials may also be used. Each of the of L-shaped members 214A has a threaded hole 215B therein. Each of the threaded holes 214B is adapted to receive a lower offsetting screw 220 therein. In a preferred embodiment of the present invention, the inner supporting ring 216 has four threaded holes 217 therein, and the number of the L-shaped members 214A is four, but other different numbers of holes 217 and of L-shaped members 214A may also be used.

The upper offsetting screws 219 are screwed into the threaded holes 217 until they are in contact with the surface of the magnet protecting member 206 within the annular notch 206A. The lower offsetting screws 220 are screwed into the threaded holes 214B of the L-shaped members 214A until they are in contact with the surface of the magnet protecting member 208 within the annular notch 208A. By suitably adjusting the position of one or more of the upper offsetting screws 219 and/or the lower adjusting screws 220, the position of the inner disc-like permanent magnet 200 along the z-axis may be offset in a direction towards or away from the inner supporting member 216. This serves to fine-tune the homogeneity of the main magnetic field within the imaging volume 177 as is disclosed in detail hereinafter.

It is noted that, suitable adjustment of one or more of the upper offsetting screws 219 and/or the lower offsetting screws 220 may also be used to tilt the surfaces 200B and 200C with respect to the Z-axis 188, such that the surface 200B of the disc-like permanent magnet 200 is tilted at an angle, referred to as the tilt angle hereinafter (not shown), with respect to the surface 204B of the annular permanent magnet 204. Such tilting may also be used for fine tuning the homogeneity of the main magnetic field within the imaging volume 177.

Additionally, in accordance with other preferred embodiments of the present invention, the position and the tilt angle of the annular permanent magnet 204 with respect to the z-axis 188 may also be varied by using a similar tilting and/or position adjusting mechanism (not shown) for adjusting the tilt angle of the annular permanent magnet 204 with respect to the z-axis 188. Such a mechanism may be constructed by using adjusting screws (not shown) for changing the tilt and position of the annular permanent magnet 204 relative to an external housing or frame (not shown) within which the permanent magnet assembly is mounted.

It will be appreciated by those skilled in the art that, in permanent magnet assemblies having more than two permanent magnets, the position and/or tilt adjustment mechanisms may be adapted to enable individual adjustment of the position and/or the tilt angle of one or more of the permanent magnets of the permanent magnet assemblies. Such adaptations to the adjustment machanisms are well known in the art and are not be disclosed in detail herein.

It is further noted that, the disc-like permanent magnet 200 may also be rotated around the z-axis 188 with respect to the annular permanent magnet 204. The rotation is performed by loosening the offsetting screws 219 and/or 220 and rotating the disc-like permanent magnet 200 and the magnet protecting members 206 and 208 attached thereto around the z-axis 188. The rotation may be performed by inserting into some of the rectangular notches 210 prongs (not shown) of an adapted turning tool (not shown) and rotating the tool. After the rotation is performed, the offsetting screws 219 and 220 may be readjusted and the offsetting or tilting procedures disclosed hereinabove may then be performed if further fine tuning is required.

It is yet further noted that, the permanent magnet assembly 160 of FIG. 16 may also include an external housing (not shown) preferably made from a non-ferromagnetic material having low electrical conductivity such as plastic, fiberglass or the like. This housing may be used for protecting the permanent magnets 204 and 206 and for attaching the permanent magnet assemblies 160 and 162 to the mounting members 176 and 180 of FIG. 13.

It is still further noted that, while the permanent magnet 200 is shown as a disc-like permanent magnet, in may also be an annular permanent magnet having a hole (not shown) therewithin, such as, for example, the annular permanent magnet 11 of FIG. 1. Additionally, while the permanent magnet assembly 160 of FIG. 16 is shown to have two permanent magnets, other preferred embodiments may have other larger numbers of concentric permanent magnets. Typically, the permanent magnet assemblies 160 and 162 may each include 2–6 concentric permanent magnets as disclosed hereinabove and in U.S. patent application Ser. No. 09/161,336, to Zuk et al.

Furthermore, it will be appreciated by those skilled in the art that, the particular mechanical design of the parts for holding together and turning the magnetic assemblies of FIG. 16 are given by way of example only and that many other arrangements for adjusting the position and the tilt angle of the permanent magnets with respect to the z-axis may be used which are within the scope and spirit of the present invention.

Briefly returning to FIG. 15, The magnetic apparatus 150 is shown attached to a motorized gantry 199. The base 156 is rigidly attached to the gantry 199. A patient is shown lying on a surgical table 181 and the head of the patient 179 is disposed in the region 164 between the permanent magnet assemblies 160 (not shown) and 162. In this position, part of the brain (not shown) of the patient may be placed within the imaging volume 177 (not shown for the sake of clarity of illustration) for imaging thereof. The details of the gantry 199 are not the subject of the present invention and are not disclosed hereinafter.

Turning back to FIG. 13, the electromagnet assemblies 150 and 152 may be any suitable type of electromagnet known in the art. In accordance with one preferred embodiment of the present invention the electromagnet assemblies 150 and 152 may be resistive electromagnets each including one or more resistive coils for generating a magnetic field in the imaging volume 177. The structure and design of resistive electromagnets is well known in the art and will not be disclosed in detail hereinafter. Preferably, the resistive electromagnets 150 and 152 may be implemented using a of Helmholtz coil pair (not shown). One of the coils of the Helmholtz pair (not shown) is disposed within the housing 150H of the electromagnet assembly 150 and the other coil (not shown) of the Helmholtz pair is disposed within the housing 152H of the electromagnet assembly 152. The Helmholtz coil pair is arranged such that the z-axis passes through the center of each of the coils (not shown) of the Helmholtz pair. The structure and design considerations of Helmholtz pair electromagnets is well known in the art and will not be disclosed in detail hereinafter. Briefly, the structure and geometrical parameters of Helmoltz coil pair are defined in page 919 of "THE McGRAW-HILL DICTIONARY OF SCIENTIFIC AND TECHNICAL TERMS" Fifth edition, Edited by Sybil P. Parker (1994). An advantage of the Helmholtz pair electromagnet is that it is relatively simple and inexpensive to implement while providing a fairly uniform magnetic field which may be further corrected and turned by the permanent magnet assemblies 160 and 162.

Figure 17:
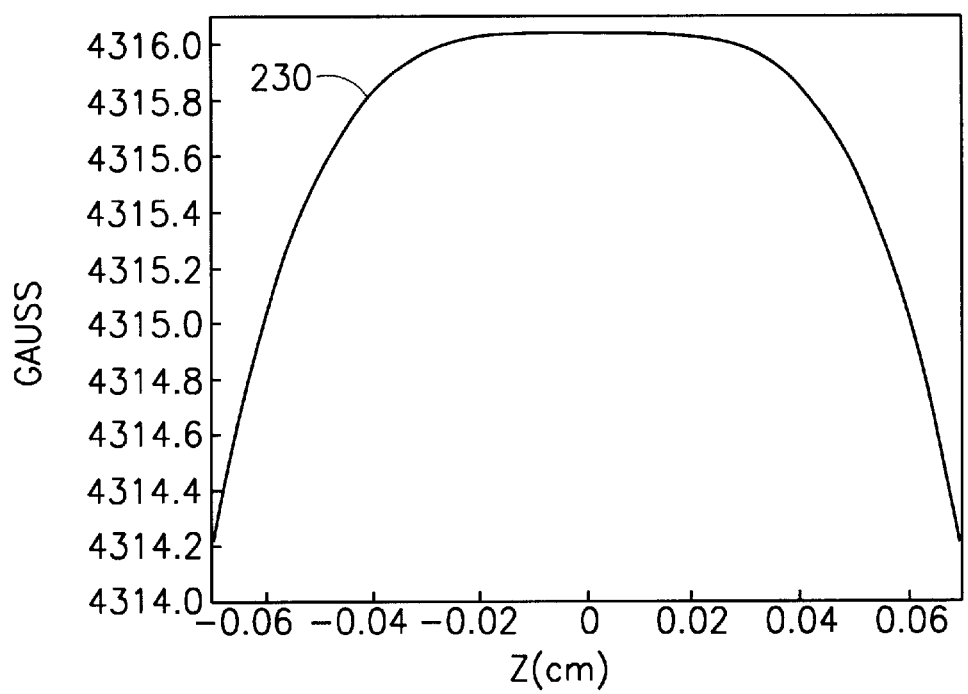
FIG. 17 is a schematic graph illustrating the computed magnitude of the magnetic field along the z-axis of an electromagnetic flux generator using a Helmholtz pair electromagnet.

Reference is now made to FIG. 17 which is a schematic graph illustrating the computed magnitude of the magnetic field along the z-axis of an electromagnetic flux generator using Helmholtz pair electromagnets. The vertical axis of the graph represent the magnitude of the magnetic field generated by a helmholtz pair electromagnet along the z-axis which is the common axis passing through the center of both of the coils (not shown) of the Helmholtz pair electromagnet. The horizontal axis represents the distance in centimeters along the z-axis of the magnetic flux generator.

The zero point on the horizontal axis represents the midpoint of the z-axis, negative distance represent points on the z-axis left of the zero point and positive distance values represent points on the z-axis right of the zero point. The computation was performed for a Helmholtz pair having a coil radius of approximately 50 centimeter. The distance between the centers of the coils (not shown) of the Helmholtz pair is therefore approximately 50 centimeters. The curve 230 represents the computed magnitude of the magnetic field at the z-axis as a function of the position along the z-axis 188. The graph shows a magnetic field magnitude of approximately 4316 Gauss at the zero point of the z-axis. At the distances of +5.0 centimeters and −5.0 centimeters on the z-axis the computed magnitude of the magnetic field drops to a value of approximately 4315.5 Gauss which is a drop of 0.5 Gauss for a 5 centimeter distance from the zero point. By itself, this field homogeneity is not adequate for conventional MRI imaging.

Figure 18:
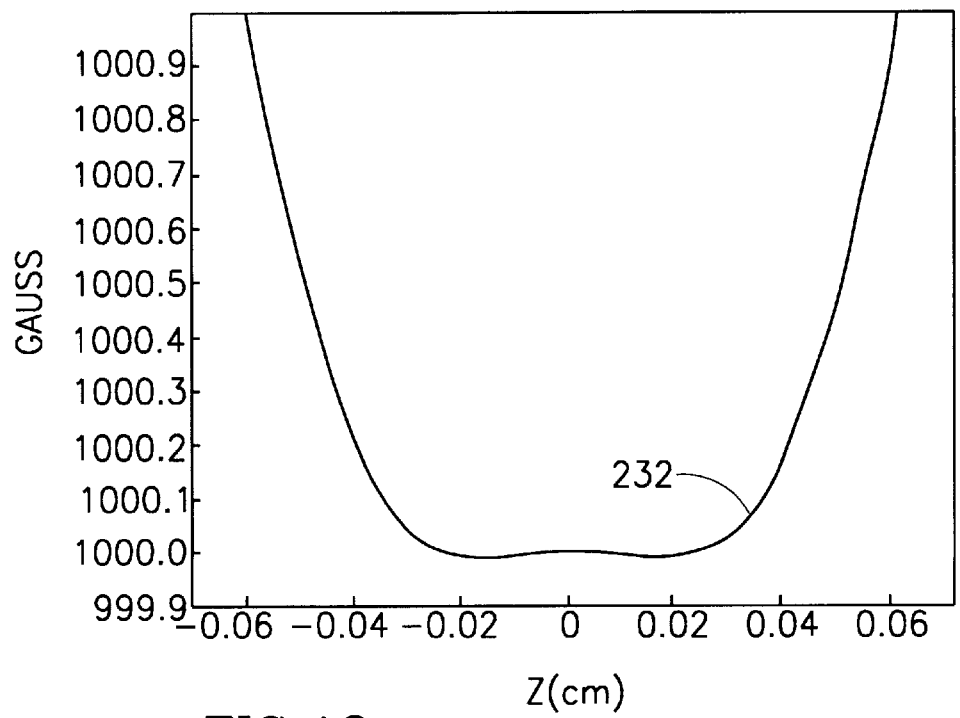
FIG. 18 is a schematic graph illustrating the computed magnitude of the magnetic field along the z-axis common to a pair of permanent magnet assemblies designed for generating a permanent magnetic field useful for improving the magnetic field homogeneity of the magnetic field of the Helmholtz pair electromagnets used in the computation illustrated in FIG. 17.

Reference is now made to FIG. 18 which is a schematic graph illustrating the computed magnitude of the magnetic field along the z-axis common to a pair of permanent magnet assemblies designed for generating a permanent magnetic field useful for improving the magnetic field homogeneity of the magnetic field of the Helmholtz pair electromagnets whose magnetic field is computed in FIG. 17. The vertical axis of the graph represent the computed magnitude of the magnetic field generated the pair of permanent magnet assemblies along the z-axis which is the common axis passing through the center of both permanent magnet assemblies (not shown). The horizontal axis represents the distance in centimeters along the z-axis common to both of the permanent magnet assemblies. Each of the two permanent Magnet assemblies for which the computation was performed included three concentric annular permanent magnets (not shown). The outer diameter of the largest outermost annular permanent magnet of each of the permanent magnet assemblies was approximately 19 centimeters.

The zero point on the horizontal axis represents the midpoint of the z-axis, negative distance represent points on the z-axis left of the zero point and positive distance values represent points on the z-axis right of the zero point. The curve 232 represents the computed magnitude of the magnetic field at the z-axis as a function of the position along the z-axis 188. The computation shows a magnetic field magnitude of approximately 1000 Gauss at the zero point of the z-axis. At the distances of +5.0 centimeters and −5.0 centimeters on the z-axis the magnitude of the magnetic field rises to a value of approximately 1000.5 Gauss which is an increase of 0.5 Gauss for a 5 centimeter distance from the zero point.

Figure 19:
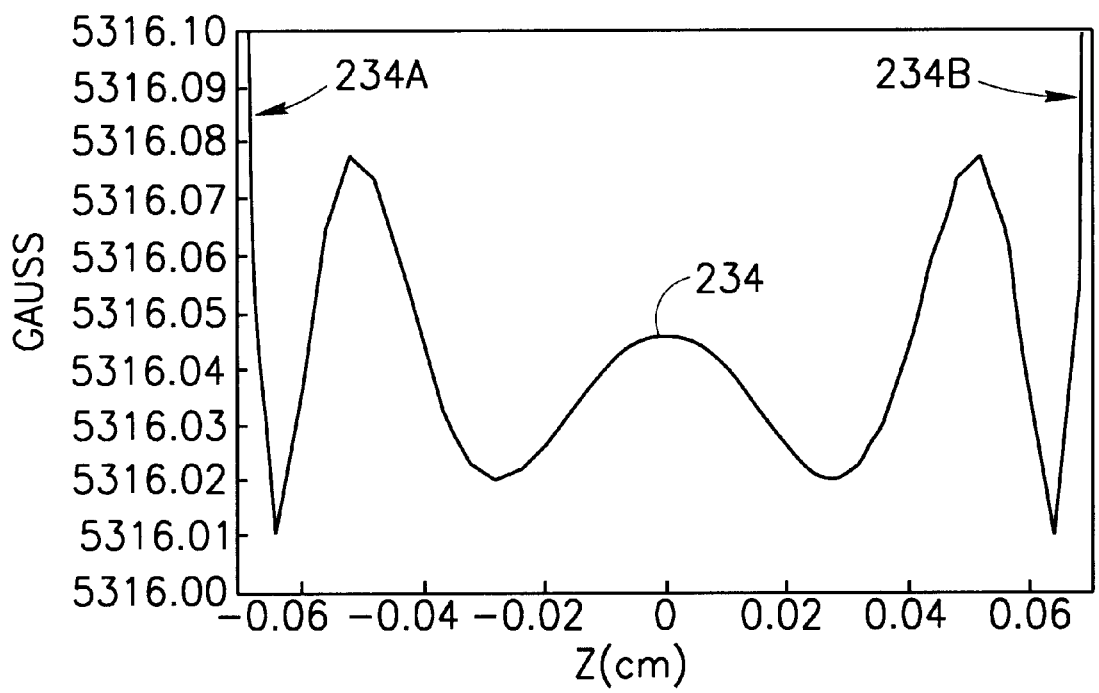
FIG. 19 is a schematic graph illustrating the computed magnitude of the magnetic field resulting from the superposition of the computed magnetic fields illustrated in FIGS. 17 and 18.

Reference is now made to FIG. 19 which is a schematic graph illustrating the computed magnitude of the magnetic field resulting from the superposition of the computed magnetic fields illustrated in FIGS. 17 and 18. The vertical axis of the graph of FIG. 19 represent the magnitude at the z-axis of the superimposed computed magnetic fields represented by the curves 230 and 232 of FIGS. 17 and 18, respectively. The horizontal axis represents the distance in centimeters along the z-axis common to the permanent magnet assemblies and to the Helmholz pair electromagnet.

The curve 234 represents the computed magnitude at the z-axis of the superimposed magnetic fields represented by the curves 230 and 232 as a function of the position along the z-axis 188. The computated curve 234 shows a mean magnetic field magnitude along the z-axis of approximately 5316 Gauss with a homogeneity of approximately ±10 parts per million (ppm) within a distance of approximately ±7 centimeters from the zero point of the z-axis.

It is noted that, the computed superimposed magnetic field magnitude represented by the curve 234 exhibits a very steep rate of rise at distances of approximately 7 centimeters or higher from the zero point of the z-axis. These "shoulders" with steep rate of rise of the curve 234 are labeled 234A and 234B. This feature is advantageous since it prevents magnetic field folding during imaging when the linear magnetic field gradients generated by the gradient coil assemblies 190 and 192 of FIG. 13 are superimposed on the main magnetic field of the hybrid magnetic apparatus 150. Magnetic field folding typically results in deterioration of image quality and resolution induced by the defocusing effects of RF signals which are generated in tissue regions outside of the FOV but adjacent thereto. Such regions may experience magnetic field values which are identical to the values of the magnetic field experienced by tissue regions within the field of view. Therefore, the RF signals generated by tissue regions inside and outside the FOV will have identical frequencies which results in pixel folding and defocusing of the image within the FOV. This problem is particularly aggravated in imaging situations, such as, for example, in restricted organ or body part imaging in which the local receiving RF coils used may be positioned close to tissue regions disposed outside of the FOV.

Therefore, the steep rate of change of the magnetic field at the curve shoulders 234A and 3234B advantageously results in an improved focused field of view (FOV) due to elimination or reduction of pixel folding.

Another advantage of the main magnetic fields generated by the hybrid magnetic apparatus of the present invention is that the magnitude of the main magnetic field is substantially higher than the magnetic field achieved by using only the permanent magnet assemblies disclosed hereinabove, while still having an acceptable degree of homogeneity. This advantage results from the method of designing of the hybrid magnetic apparatus 150 of the present invention. In the design method of the present invention the electromagnet coils of the electromagnet assemblies 150 and 152 and the permanent magnet assemblies 160 and 162 are designed together such that the permanent magnet assemblies 160 and 162 are adapted to improve the homogeneity of the overall resulting magnetic field and to provide a steep rate of change of the magnetic field magnitude at the edges of the FOV.

It is noted that, while the particular computed example of the magnetic field curve 234 includes shoulders 234A and 234B having a steep rate of rise of the magnetic field amplitude, the present invention may also be practiced by generating magnetic field curves having shoulder curve portions with a steep rate of decrease of magnetic field magnitude. Thus, the curve shoulders of the magnetic field curves useful in the present invention are generally characterized by a steep rate of change, irrespective of the change direction.

It is further noted that, in accordance with another preferred embodiment of the present invention, the electromagnet assemblies 150 and 152 may be superconducting electromagnet assemblies. The design and operation of superconducting magnets is well known in the art and will not be disclosed in detail hereinafter. Any suitable design of superconducting electromagnets known in the art may be adapted for implementing the hybrid magnetic apparatus 150 of the present invention. For example, the electromagnet assemblies 150 and 152 may be implemented as superconducting magnets having a single or multiple superconducting coils. The electromagnet assemblies 150 and 152 may also be implemented as superconducting magnets configured as a superconducting Helmholtz pair.

It is still further noted that if the electromagnets used in the construction of the electromagnet assemblies 150 and 152 are resistive electromagnets, any suitable coil configuration known in the art may be used, including, but not limited to, designs having multiple electromagnet coils which are disposed within each of the electromagnet assemblies 150 and 152.

It will be appreciated that the MRI and/or interventional magnetic resonance imaging (IMRI) systems (not shown) which include the hybrid magnetic apparatus include additional parts and components which are necessary to the operation of such systems for imaging. Such components may include power supplies, receiving and transmitting RF coils and RF signal generator and receiver circuitry, active shimming coils, passive shimming members, gradient amplifiers, and various components for controlling the operation of the system for acquiring and processing imaging data and for displaying and storing MRI images. Additionally, the systems may include temperature stabilization systems for regulating the temperature of various system components such as the permanent magnet assemblies, the electromagnet assemblies. Furthermore, if the electromagnet assemblies 150 and 152 are of the superconducting electromagnet type, the system may include all the necessary components such as cryogenic Dewars and the like for cooling the superconducting coils to the required temperature and for maintaining the required temperature. The construction and operation of such components is well known in the art and is therefore not disclosed herein in detail.

It will be appreciated by those skilled in the art that the number, shape and arrangement of the annular permanent magnets of the permanent magnet assemblies 160 and 162 of FIGS. 13–15 are not limited to the shapes and arrangements disclosed hereinabove and that the number shapes and arrangement of the annular permanent magnets included in the permanent magnet assemblies 160 and 162 of FIGS. 13–15 may be varied and modified in accordance with factors such as, inter alia, the required magnitude and degree of homogeneity of the main magnetic field within the imaging volume 177, the desired dimensions of the permanent magnetic assemblies 160 and 162, the required size of the imaging volume 177, the degree of homogeneity of the magnetic field provided by the electromagnetic flux generator, the magnetization value of the permanent magnet material available for constructing the annular permanent magnets and a variety of other manufacturing considerations such as the weight and cost of construction of the permanent magnetic assemblies.

Furthermore, while the preferred embodiments of the permanent magnet assemblies disclosed hereinabove illustrate annular or disc-like permanent magnets shaped as structures which are circularly symmetric with respect to the z-axis 188 of the magnetic apparatus 150, other preferred embodiments of the present invention may use other suitable shapes of permanent magnet assemblies, provided that the shapes of the permanent magnet assemblies are radially symmetric with respect to the z-axis 188. For example, the disc-like permanent magnet 200 of FIG. 16 which has a circular cross-section in a plane (not shown) perpendicular to the z-axis 188 may be replaced by a right regular polygonal prism having N sides, wherein the number of sides N is large enough to provide the magnetic field homogeneity requested within the imaging volume 177 for imaging. Preferably, the number of sides is N≧8, but other numbers may be used depending, inter alia, on the requested degree of homogeneity of the magnetic field within the imaging volume 177, and on the precise geometrical shape of the electromagnetic coils within the electromagnet assemblies 150 and 152. In another non-limiting example, the annular permanent magnet 204 of FIG. 16 may be replaced by a right regular polygonal ring structure having N sides, wherein the number of sides N is large enough to provide the magnetic field homogeneity requested within the imaging volume 177 for imaging. Preferably, the number of sides is N≧8, but other numbers may be used depending, inter alia, on the requested degree of homogeneity of the magnetic field within the imaging volume 177, and on the precise geometrical shape of the electromagnet coils within the electromagnet assemblies 150 and 152.

Furthermore, while the electromagnet coils within the electromagnet assemblies are preferably coils having a circular cross-section, in accordance with another preferred embodiment of the present invention any suitable coil shape may be used as long as the finally achieved degree of homogeneity of magnetic field within the imaging volume 177 is sufficient for performing MRI. For example, the electromagnet coils (not shown) may have a regular polygonal ring like structure having N sides, wherein the number of sides N is large enough to provide the magnetic field homogeneity requested within the imaging volume 177 for imaging. Preferably, the number of sides is N≧8, but other numbers of sides may be used depending, inter alia, on the requested degree of homogeneity of the magnetic field within the imaging volume 177, and on the precise geometrical shape of the annular and disc-like permanent magnets included within the permanent magnet assemblies 160 and 162.

It will be appreciated that various modifications to the above-described embodiment will be apparent to those of ordinary skill in the art in light thereof. The above embodiments are provided by way of illustration and not by way of limitation.

We claim:

1. Open magnetic apparatus for use in an MRI or IMRI device to produce a predetermined volume of substantially uniform magnetic field directed parallel to an axis of symmetry of said volume, the apparatus comprising:

a first electromagnet assembly disposed at a first position along said axis, said first electromagnet assembly includes at least a first electromagnet coil, said at least first coil is radially symmetric with respect to said axis;

a second electromagnet assembly disposed at a second position spaced apart from said first position of said electromagnet assembly along said axis, said second electromagnet assembly includes at least a second electromagnet coil, said at least second coil is radially symmetric with respect to said axis, said at least first coil and said at least second coil are equidistant from the center of said volume, said first electromagnet assembly and said second electromagnetic assembly are adapted for generating a first magnetic field within said volume;

a first permanent magnet assembly positioned at a third position disposed between said first position and said second position along said axis, said first permanent magnet assembly has an inner surface facing said volume and an outer surface facing said first electromagnet assembly, said first permanent magnet assembly includes, a first permanent magnet having an outer diameter, said first permanent magnet is radially symmetric with respect to said axis and has a first magnetization direction parallel to said axis, at least a second annular permanent magnet coaxial with said first permanent magnet, said at least second permanent magnet has an inner diameter larger than said outer diameter of said first permanent magnet, said second permanent magnet is radially symmetric with respect to said axis and has a second magnetization direction parallel to said axis, and a first low magnetic permeability frame for supporting said first permanent magnet and said at least second permanent magnet; and a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes, a third permanent magnet having an outer diameters, said third permanent magnet is radially symmetric with respect to said axis and has a magnetization direction identical to said first magnetization direction, at least a fourth permanent magnet coaxial with said third permanent magnet, said at least fourth permanent magnet has an inner diameter larger than said outer diameter of said third permanent magnet, said fourth permanent magnet is radially symmetric with respect to said axis and has a magnetization direction identical to said second magnetization direction, and a second low magnetic permeability frame for supporting said third permanent magnet and said at least fourth permanent magnet, wherein the inner surface of said first permanent magnet assembly and the inner surface of said second permanent magnet assembly define an open region therebetween, said volume is disposed within said open region, said third position of said first permanent magnetic assembly and said fourth position of second permanent magnetic assembly are equidistant along said axis from the center of said volume and wherein said first permanent magnetic assembly and said second permanent magnetic assembly are adapted to generate a second magnetic field superimposed on said first magnetic field to provide said substantially uniform magnetic field within said volume.

2. The magnetic apparatus according to claim 1, wherein said first magnetization direction is oriented parallel to said second magnetization direction.

3. The magnetic apparatus according to claim 1, wherein said first magnetization direction is oriented anti-parallel to said second magnetization direction.

4. The magnetic apparatus according to claim 1, wherein said at least first electromagnet coil and said at least second electromagnet coil are operatively arranged as a Helmholtz pair.

5. The magnetic apparatus according to claim 1, wherein said first low magnetic permeability frame is adapted for varying the position of at least said first permanent magnet along said axis, and said second low magnetic permeability frame is adapted for varying the position of at least said third permanent magnet along said axis.

6. The magnetic apparatus according to claim 1, wherein said first low magnetic permeability frame is adapted for varying the tilt angle of at least said first permanent magnet with respect to said axis, and said second low magnetic permeability frame is adapted for varying the tilt angle of at least said third permanent magnet with respect said axis.

7. The magnetic apparatus according to claim 1, wherein said at least first electromagnet coil and said at least second electromagnet coil are resistive electromagnet coils.

8. The magnetic apparatus according to claim 1, wherein said at least first electromagnet coil and said at least second electromagnet coil are superconducting electromagnet coils.

9. The magnetic apparatus according to claim 1, further including a first gradient coil assembly disposed between said outer surface of said first permanent magnet assembly and said first electromagnet assembly, and a second gradient coil assembly disposed between said outer surface of said second permanent magnet assembly and said second electromagnet assembly.

10. The magnetic apparatus according to claim 9, wherein each of said first gradient coil assembly and said second gradient coil assembly includes one or more gradient coils selected from an x-gradient coil, a y-gradient coil, a z-gradient coil and any combination thereof.

11. The magnetic apparatus according to claim 10, wherein each of said first gradient coil assembly and said second gradient coil assembly is a multi-layer printed circuit assembly, and wherein at least one of said x-gradient coil, y-gradient coil and z-gradient coil of each of said first gradient coil assembly and said second gradient coil assembly is a substantially planar printed circuit coil.

12. The magnetic apparatus according to claim 1, wherein said first and said third permanent magnets are selected from a disc-like permanent magnet having a circular cross section in a plane perpendicular to said axis, a regular right polygonal prism-like permanent magnet having a regular polygonal cross-section in a plane perpendicular to said axis and having N sides, a ring-like annular permanent magnet and a annular right regular polygonal permanent magnet having N sides.

13. The magnetic apparatus according to claim 12, wherein N is equal to or larger than eight.

14. The magnetic apparatus according to claim 1, wherein said at least second and said at least fourth permanent magnets are selected from a ring-like annular permanent magnet and an annular right regular polygonal permanent magnet having N sides.

15. The magnetic apparatus according to claim 14, wherein N is equal to or larger than eight.

16. The magnetic apparatus according to claim 1, wherein said at least first electromagnet coil and said at least second electromagnet coil are selected from a circular coil and a regular polygonal shaped coil having N sides.

17. The magnetic apparatus according to claim 16, wherein N is equal to or larger than eight.

18. The magnetic apparatus according to claim 1, wherein said first permanent magnet and said third permanent magnet comprise a plurality of permanently magnetized segments attached to adjacent segments using a non-conductive adhesive, so as to reduce eddy currents.

19. The magnetic apparatus according to claim 18, wherein said segments are equi-angular segments.

20. The magnetic apparatus according to claim 1, wherein said at least second annular permanent magnet and said at least fourth annular permanent magnet comprise a plurality of permanently magnetized segments attached to adjacent segments using a non-conductive adhesive, so as to reduce eddy currents.

21. The magnetic apparatus according to claim 20, wherein said segments are equi-angular segments.

22. A method for constructing an open magnetic apparatus for use in an MRI or IMRI device to produce a predetermined volume of substantially uniform magnetic field directed parallel to an axis of symmetry of said volume, the method comprising the steps of:

providing a first electromagnet assembly disposed at a first position along said axis, said first electromagnet assembly includes at least a first electromagnet coil, said at least first coil is radially symmetric with respect to said axis;

providing a second electromagnet assembly disposed at a second position spaced apart from said first position of said electromagnet assembly along said axis, said second electromagnet assembly includes at least a second electromagnet coil, said at least second coil is radially symmetric with respect to said axis, said at least first coil and said at least second coil are equidistant from the center of said volume, said first electromagnet assembly and said second electromagnetic assembly are adapted for generating a first magnetic field within said volume;

providing a first permanent magnet assembly positioned at a third position disposed between said first position and said second position along said axis, said first permanent magnet assembly has an inner surface facing said volume and an outer surface facing said first electromagnet assembly, said first permanent magnet assembly includes, a first permanent magnet having an outer diameter, said first permanent magnet is radially symmetric with respect to said axis and has a first magnetization direction parallel to said axis, at least a second annular permanent magnet coaxial with said first permanent magnet, said at least second permanent magnet has an inner diameter larger than said outer diameter of said first permanent magnet, said second permanent magnet is radially symmetric with respect to said axis and has a second magnetization direction parallel to said axis, and a first low magnetic permeability frame for supporting said first permanent magnet and said at least second permanent magnet; and providing a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes, a third permanent magnet having an outer diameter, said third permanent magnet is radially symmetric with respect to said axis and has a magnetization direction identical to said first magnetization direction, at least a fourth permanent magnet coaxial with said third permanent magnet, said at least fourth permanent magnet has an inner diameter larger than said outer diameter of said third permanent magnet, said fourth permanent magnet is radially symmetric with respect to said axis and has a magnetization direction identical to said second magnetization direction, and a second low magnetic permeability frame for supporting said third permanent magnet and said at least fourth permanent magnet, wherein the inner surface of said first permanent magnet assembly and the inner surface of said second permanent magnet assembly define an open region therebetween, said volume is disposed within said open region, said third position of said first permanent magnetic assembly and said fourth position of second permanent magnetic assembly are equidistant along said axis from the center of said volume and wherein said first permanent magnetic assembly and said second permanent magnetic assembly are adapted to generate a second magnetic field superimposed on said first magnetic field to provide said substantially uniform magnetic field within said volume.

23. A method for providing a substantially homogenous magnetic field within a volume disposed in an open region within a magnetic apparatus the method comprising the steps of:

providing a first electromagnet assembly disposed at a first position along said axis, said first electromagnet assembly includes at least a first electromagnet coil, said at least first coil is radially symmetric with respect to said axis, and a second electromagnet assembly disposed at a second position spaced apart from said first position of said electromagnet assembly along said axis, said second electromagnet assembly includes at least a second electromagnet coil, said at least second coil is radially symmetric with respect to said axis, said at least first coil and said at least second coil are equidistant from the center of said volume;

providing a first permanent magnet assembly positioned at a third position disposed between said first position and said second position along said axis, said first permanent magnet assembly has an inner surface facing said volume and an outer surface facing said first electromagnet assembly, said first permanent magnet assembly includes, a first permanent magnet having an outer diameter, said first permanent magnet is radially symmetric with respect to said axis and has a first magnetization direction parallel to said axis, at least a second annular permanent magnet coaxial with said first permanent magnet, said at least second permanent magnet has an inner diameter larger than said outer diameter of said first permanent magnet, said second permanent magnet is radially symmetric with respect to said axis and has a second magnetization direction parallel to said axis, and a first low magnetic permeability frame for supporting said first permanent magnet and said at least second permanent magnet, and a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes, a third permanent magnet having an outer diameter, said third permanent magnet is radially symmetric with respect to said axis and has a magnetization direction identical to said first magnetization direction, at least a fourth permanent magnet coaxial with said third permanent magnet, said at least fourth permanent magnet has an inner diameter larger than said outer diameter of said third permanent magnet, said fourth permanent magnet is radially symmetric with respect to said axis and has a magnetization direction identical to said second magnetization direction, and a second low magnetic permeability frame for supporting said third permanent magnet and said at least fourth permanent magnet, wherein the inner surface of said first permanent magnet assembly and the inner surface of said second permanent magnet assembly define an open region therebetween, said volume is disposed within said open region, said third position of said first permanent magnet assembly and said fourth position of second permanent magnetic assembly are equidistant along said axis from the center of said volume, and wherein said first permanent magnetic assembly and said second permanent magnetic assembly generate a first permanent magnetic field in said volume;

electrically energizing said first electromagnet assembly and said second electromagnetic assembly to provide a second magnetic field within said volume, wherein said second magnetic field is superimposed on said first permanent magnetic field to provide said substantially uniform magnetic field within said volume.

* * * * *